United States Patent
Park

(10) Patent No.: US 11,439,009 B2
(45) Date of Patent: Sep. 6, 2022

(54) PRINTED CIRCUIT BOARD AND ELECTRONIC DEVICE INCLUDING THE SAME

(71) Applicant: Samsung Electronics Co., Ltd., Gyeonggi-do (KR)

(72) Inventor: Sungwon Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/118,757

(22) Filed: Dec. 11, 2020

(65) Prior Publication Data
US 2021/0185809 A1 Jun. 17, 2021

(30) Foreign Application Priority Data

Dec. 11, 2019 (KR) .................... 10-2019-0164882

(51) Int. Cl.
*H05K 1/11* (2006.01)
*H05K 1/02* (2006.01)

(52) U.S. Cl.
CPC .......... *H05K 1/115* (2013.01); *H05K 1/0225* (2013.01); *H05K 2201/09681* (2013.01)

(58) Field of Classification Search
CPC .... H05K 1/115; H05K 1/0225; H05K 1/0224; H05K 1/025; H05K 1/147; H05K 1/0251; H05K 1/0218; H05K 2201/09681; H05K 1/0221; H05K 3/4691; H05K 2201/09263; H05K 2201/09545; H05K 2201/10128; H04M 1/0214
See application file for complete search history.

(56) References Cited

U.S. PATENT DOCUMENTS

| 9,485,859 | B1 | 11/2016 | Hu et al. |
| 2001/0010271 | A1 | 8/2001 | Lin et al. |

(Continued)

FOREIGN PATENT DOCUMENTS

| CN | 101897080 B | * | 7/2013 | ............... H01Q 9/16 |
| JP | H05343820 A | | 12/1993 | |

(Continued)

OTHER PUBLICATIONS

Machine Translation of Kojima (CN101897080B) provided with Office Action (Year: 2013).*

(Continued)

*Primary Examiner* — Roshn K Varghese
(74) *Attorney, Agent, or Firm* — Cha & Reiter, LLC

(57) ABSTRACT

Various embodiments relate to an apparatus. The apparatus may include: a first printed circuit board including a first ground layer having one or more openings formed therein and a wiring layer on which a signal wire is disposed; a second printed circuit board including a second ground layer having one or more openings formed therein; a first area and a third area in which the first printed circuit board and the second printed circuit board are connected to each other via an insulating layer; and a second area, which extends from the first area to the third area, and in which the first printed circuit board and the second printed circuit board are spaced apart from each other, with an air layer interposed therebetween. Various other embodiments may be possible.

18 Claims, 19 Drawing Sheets

(56) References Cited

U.S. PATENT DOCUMENTS

| | | |
|---|---|---|
| 2009/0133906 A1 | 5/2009 | Baek |
| 2009/0173533 A1* | 7/2009 | Brock .................... H01B 11/00 |
| | | 174/350 |
| 2012/0039050 A1 | 2/2012 | Chang et al. |
| 2015/0305142 A1* | 10/2015 | Matsuda ................ H01P 3/082 |
| | | 29/601 |
| 2019/0045630 A1 | 2/2019 | Kim et al. |

FOREIGN PATENT DOCUMENTS

| | | |
|---|---|---|
| JP | 2003-204129 A | 7/2003 |
| KR | 10-1133312 B1 | 4/2012 |
| KR | 10-2017-0094702 A | 8/2017 |
| KR | 20210056043 A | 5/2021 |

OTHER PUBLICATIONS

Machine Translation of Kim (KR20170094702) provided with Office Action (Year: 2017).*
International Search Report dated Apr. 8, 2021.

* cited by examiner

PRINTED CIRCUIT BOARD AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0164882, filed on Dec. 11, 2019, in the Korean Intellectual Property Office, the disclosure of which is herein incorporated by reference in its entirety.

BACKGROUND

1) Field

Certain embodiments to be described later relate to a printed circuit and an electronic device including the same.

2) Description of Related Art

An electronic device can be, at least in part, implemented by arranging various types of electronic components on a printed circuit board (PCB). In addition to the electronic components, signal wires are printed on the printed circuit board in order to connect each of the electronic components and to transmit signals between the electronic components.

The electronic device may be communicatively coupled to a communication network such as the Internet. High-speed wireless communication, such as next-generation wireless communication technology (e.g., 5G communication) or wireless gigabit alliance (WIGIG) (e.g., 802.11AD), is being developed to meet the increasing demand for wireless data traffic. The next-generation wireless communication technology may use millimeter waves of 20 GHz or higher, and in an electronic device using the next-generation wireless communication technology, the frequency of signals transmitted between semiconductor elements in the electronic device may be increased. Accordingly, a printed circuit board having a microstrip structure is used in the electronic device in order to transmit high-frequency signals.

The above information is presented as background information only to assist with an understanding of the disclosure. No determination has been made, and no assertion is made, as to whether any of the above might be applicable as prior art with regard to the disclosure.

SUMMARY

According to an embodiment, an apparatus may include, for example, a first printed circuit board including a first ground layer having a first one or more openings formed therein and a wiring layer on which a signal wire is disposed; and a second printed circuit board including a second ground layer having a second one or more openings formed therein. The printed circuit board may further include a first area and a third area in which the first printed circuit board and the second printed circuit board are connected to each other via an insulating layer, and a second area, which extends from the first area to the third area, and in which the first printed circuit board and the second printed circuit board are spaced apart from each other.

According to an embodiment, an apparatus may include, for example, a first printed circuit board including a wiring layer having a signal wire disposed thereon and disposed on the top surface of a first insulating layer, and a first ground layer disposed on the bottom surface of the first insulating layer; and a second printed circuit board including a second ground layer having one or more openings formed therein. The printed circuit board may further include: a first area and a third area in which insulating layers are interposed between the first printed circuit board and the second printed circuit board, and a second area, which extends from the first area to the third area, and in which the first printed circuit board and the second printed circuit board are spaced apart from each other.

According to an embodiment, an electronic device may include, for example, a communication circuit, and a printed circuit board electrically connected to the communication circuit. The printed circuit board may include, for example, a first printed circuit board including a first ground layer having a first one or more openings formed therein and a wiring layer on which a signal wire is disposed; and a second printed circuit board including a second ground layer having a second one or more openings formed therein. The printed circuit board may further include a first area and a third area in which the first printed circuit board and the second printed circuit board are connected to each other via insulating layers, and a second area, which extends from the first area to the third area, and in which the first printed circuit board and the second printed circuit board are spaced apart from each other.

Advantageous effects obtainable from the disclosure may not be limited to the above mentioned effects, and other effects which are not mentioned may be clearly understood, through the following descriptions, by those skilled in the art to which the disclosure pertains.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

A signal wire may have increased impedance when a conductor approaches the signal wire. An electronic device may include a printed circuit board having a microstrip structure, and the microstrip structure may include a signal wire, a ground, and a dielectric material. When a conductor (e.g., metal) approaches the signal wire, the impedance and/or signal transmission loss of the signal wire may increase due to the influence of the metal. In addition, when a signal wire is used as an RF line for transmitting a radio frequency signal, when a conductor approaches the RF line, the impedance and loss of the RF line may increase, resulting in a decrease in RF performance.

Accordingly, certain embodiments disclosed herein are capable of providing a printed circuit board, wherein a separate guard printed circuit board is disposed to be spaced apart from the printed circuit board on which a signal wire is formed. Thus it is possible to minimize the influence of metal even when the metal comes close to the signal wire.

A printed circuit board according to an embodiment is capable of reducing an influence of an increase in the impedance and/or signal transmission loss of a signal wire due to an approach of a conductor, thereby improving signal transmission performance.

A printed circuit board according to an embodiment is capable of connecting a plurality of electric elements (e.g., a printed circuit board and an antenna) in an electronic device by including a flexible portion that is deformable.

A printed circuit board according to another embodiment is applicable to a folding area in a foldable electronic device by including a flexible portion that is deformable.

The technical subjects pursued in the disclosure are not be limited to the above mentioned technical subjects, and other technical subjects which are not mentioned may be clearly understood, through the following descriptions, by those skilled in the art to which the disclosure pertains.

Hereinafter, certain embodiments of the disclosure will be described with reference to the accompanying drawings.

Figure 1:
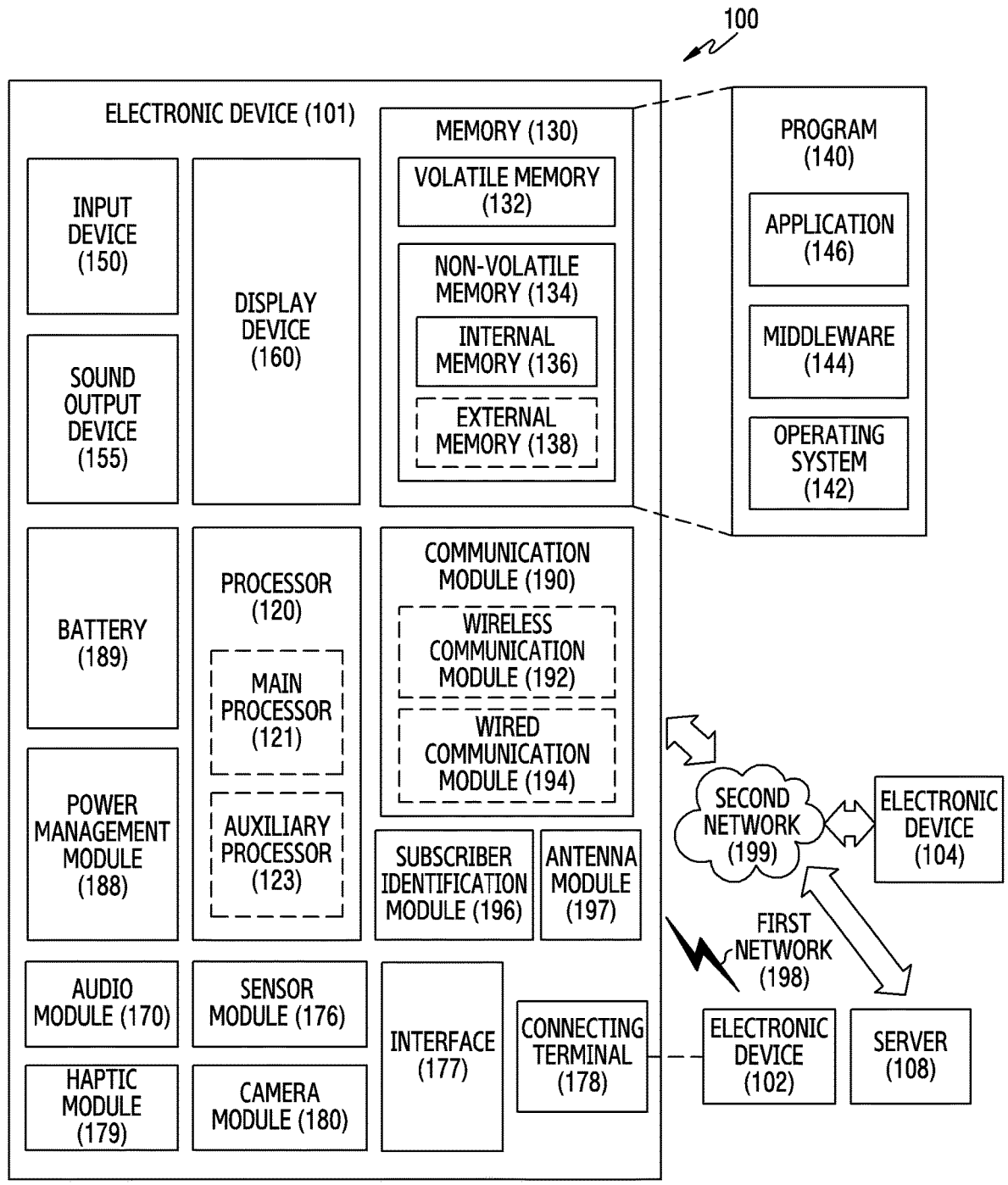
FIG. 1 is a block diagram of an electronic device according to certain embodiments in a network environment.

FIG. 1 is a block diagram of an exemplary electronic device 101 that can include electronic components mounted on PCBs that are connected by RF lines.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

"Processor" as used in this document shall be understood to refer to both the singular context as well as the plural context.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Many of the foregoing modules may be implemented by electronic components or elements mounted on a PCB. The PCB can includes signal wires that carry RF signals, such as between the communication module 190 and the processor 120. In certain embodiments, the electronic components/element and PCB may be housed in a foldable housing. Accordingly, the PCB may be flexible or a flexible PCB (FPCB).

Figure 2A:
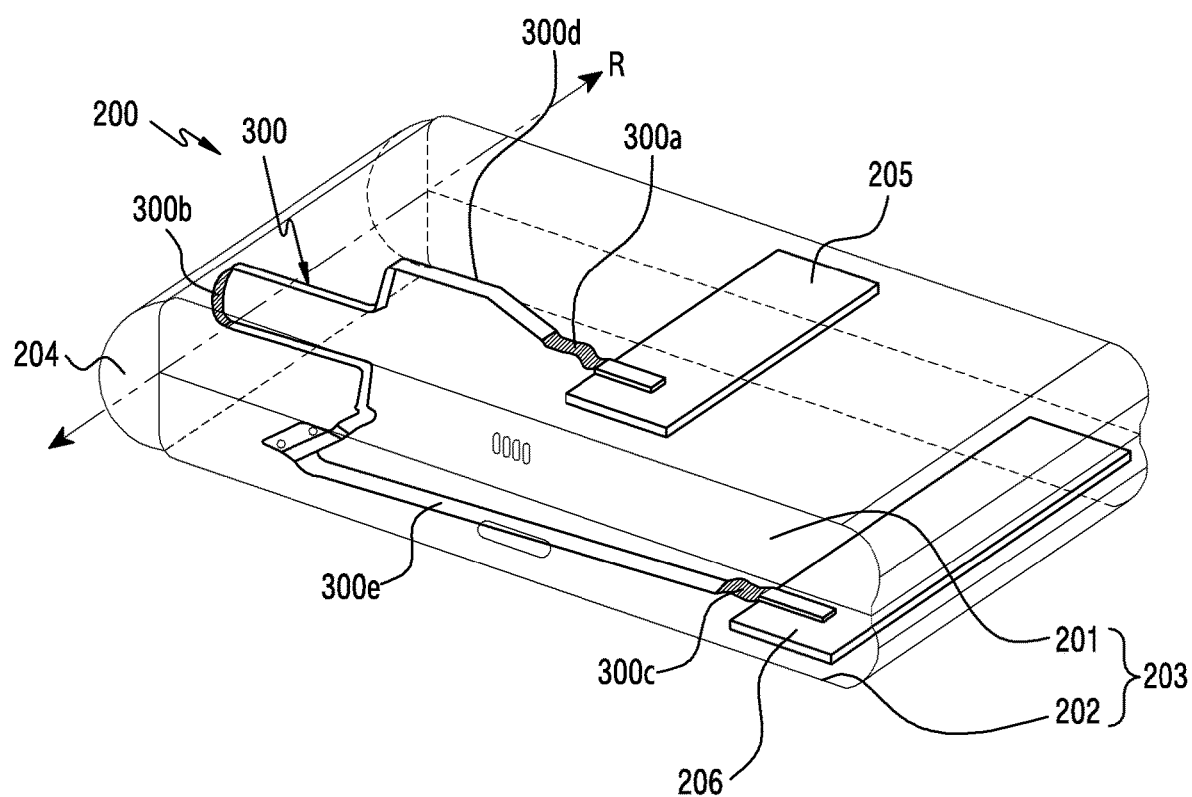
FIG. 2A is a view illustrating the internal configuration of an electronic device according to an embodiment.
Figure 2B:
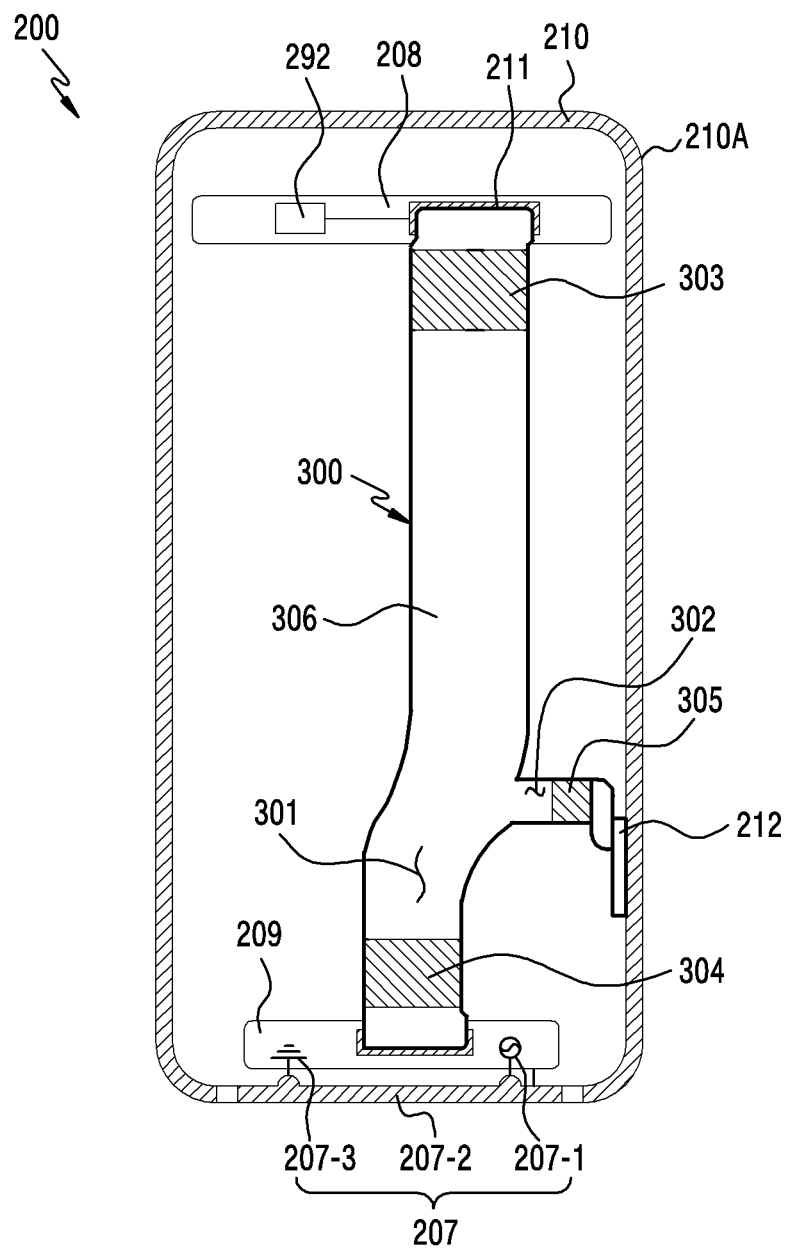
FIG. 2B is a view illustrating the internal configuration of an electronic device according to another embodiment.

FIG. 2A is a view illustrating the internal configuration of an electronic device 200 (e.g., the electronic device 101 in FIG. 1) according to an embodiment. FIG. 2B is a view illustrating the internal configuration of an electronic device 200 according to another embodiment.

The electronic device 200 includes a foldable housing 203. Due to the foldable housing 203, a first PCB 205 is connected to a second PCB 206 by PCB 300 that includes flexible portions 300*a*, 300*b*, and 300*c*. As the signal wires of the flexible portion of the PCB 300*b* approach the hinge cover 204 of the housing, signal loss occurs that increases with frequency, becoming particularly acute for frequencies exceeding 1 GHz. According to certain embodiments, the signal wires are spaced away from the hinge cover to avoid this.

Referring to FIG. 2A, an electronic device 200 according to an embodiment may include a foldable housing 203 including a first housing 201 and a second housing 202, a flexible display (not illustrated), a hinge structure (not illustrated), a hinge cover 204 that covers the hinge structure, a plurality of electric elements (e.g., components and circuits) disposed inside the foldable housing 203, and a printed circuit board 300 disposed inside the foldable housing 203 and electrically connecting the plurality of electric elements. The plurality of electric elements can implement the functions described in FIG. 1.

According to an embodiment, the first housing 201 and the second housing 202 may be rotatably connected to each other via the hinge structure, and the electronic device 200 may have a foldable structure to be switched from the folded state to the unfolded state or from the unfolded state or the folded state as the first housing 201 and the second housing 202 rotate about a folding axis (R axis) via a hinge structure.

In an example (not illustrated), when the electronic device 200 is in the unfolded state, the first housing 201 and the second housing 202 may be disposed on opposite sides of the folding axis (R axis). In another example (e.g., see FIG. 2A), when the electronic device 200 is in the folded state, the first housing 201 and the second housing 202 may be disposed to face each other.

According to an embodiment, electric elements for implementing various functions of the electronic device 200 (e.g., a first printed circuit board 205 and a second printed circuit board 206) may be disposed inside the first housing 201 and the second housing 202, and the electric elements disposed inside the first housing 201 and the electric elements disposed inside the second housing 202 may be electrically connected to each other through a printed circuit board 300 extending across the hinge structure.

In an example, the first printed circuit board 205 may be disposed inside the first housing 201, and the second printed circuit board 206 may be disposed inside the second housing 202. The first printed circuit board 205 and the second printed circuit board 206 may be electrically connected to each other via the printed circuit board 300 extending from an area of the first housing 201 to an area of the second housing 202 across the hinge structure.

According to an embodiment, the printed circuit board 300 may include multiple layers, and may serve as a connector for electrically connecting electric elements. In this case, the multiple layers of the printed circuit board 300 may include, for example, a wiring layer on which a signal wire is formed, a ground layer on which a ground is formed, and an insulating layer filling a space between the wiring layer and the ground layer, which will be described later. Via the printed circuit board 300 including the signal wire, the first printed circuit board 205 may transmit a signal to the second printed circuit board 206, or may receive a signal from the second printed circuit board 206. Similarly, via the printed circuit board 300 including the signal wire, the second printed circuit board 206 may transmit a signal to the first printed circuit board 205, or may receive a signal from the first printed circuit board 205.

However, the electric elements electrically connected via the printed circuit board 300 are not limited to the above-described embodiments. According to certain embodiments, the printed circuit board 300 may electrically connect the first printed circuit board 205 to an antenna module, or may electrically connect the second printed circuit board 206 to a patch antenna. A detailed description thereof will be described later.

According to an embodiment, the printed circuit board 300 may include one or more flexible areas 300a, 300b, and 300c and one or more rigid areas 300d and 300e. In an example, the flexible areas (e.g., 300a and 300c) may be disposed in an area adjacent to an electric element (e.g., the first printed circuit board 205 or the second printed circuit board 206), and the rigid areas 300d and 300e, which are less flexible than the flexible areas, may be disposed between the flexible areas (e.g., 300a, 300b, and 300c).

According to an embodiment, since the printed circuit board 300 is disposed across the hinge structure, a flexible area (e.g., 300b) may be disposed in an area of the printed circuit board 300 corresponding to the hinge structure. For example, via the flexible area 300b disposed in the area corresponding to the hinge structure, the printed circuit board 300 can be flexibly curved or bent when the electronic device 200 is switched from the folded state to the unfolded state, or when the electronic device 200 is switched from the unfolded state to the folded state.

That is, according to an exemplary embodiment, the printed circuit board 300 may be made to have a flexible characteristic in an area adjacent to an electric element (e.g., the first printed circuit board 205 or the second printed circuit board 206) and/or an area corresponding to the hinge structure so as to improve the bonding property between the printed circuit board 300 and the electric element and to prevent the printed circuit board 300 from being damaged during the process of folding the electronic device 200. As an example, the remaining areas of the printed circuit board 300 may have a rigid characteristic so as to secure the overall rigidity of the printed circuit board 300.

However, the printed circuit board 300 is not limited to the above-described embodiment, and according to another embodiment, the printed circuit board 300 may only include a flexible area without being divided into the flexible areas (e.g., 300a, 300b, and 300c) and the rigid areas (e.g., 300d and 300e). In an example, an area of the printed circuit board 300 to be connected to an electric element may be formed as a rigid area, and the other areas may be formed as flexible areas. However, a description of a configuration for making the printed circuit board 300 have the flexible characteristic and/or the rigid characteristic will be described in detail below.

Referring to FIG. 2B, according to another embodiment, the electronic device 200 (e.g., the electronic device 101 in FIG. 1) may include a housing 210, a plurality of electric elements (e.g., components and circuits) located inside the housing 210, and a printed circuit board 300 electrically connecting the plurality of electric elements.

In FIG. 2B, a PCB 300 connects a patch antenna 212, antenna 207, via a connector 211 to a main circuit board 208 having a wireless communication unit 292 disposed thereon. The PCB 300 includes a ground layer, an insulation layer, and wiring layer. The wiring layer can electrically connected the patch antenna 212, antenna 207, and main circuit board 208. The PCB 300 can also include flexible areas 303, 304, and 305, as well as rigid area(s) 306.

According to an embodiment, the housing 210 may form at least a portion of the side surface 210A or the rear surface (not illustrated) of the electronic device 200. As an example, the side surface 210A may be formed by a side bezel structure (or a "side member") including a metal and/or a polymer, and the rear surface may be formed by a substantially opaque rear plate and may be coupled to the side surface 210A. However, the structure of the housing 210 is not limited to the above-described embodiment, and according to an embodiment, the side surface 210A and the rear surface of the housing 210 may be integrally formed. According to an embodiment, the electronic device 200 may be configured in the state in which the side surface 210A of the housing 210 is not present. For example, the side surface of the housing 210 may be configured by a portion of a display disposed on the front surface and extending to the side surface. According to an embodiment, when the side surface of the housing 210 included in the electronic device 200 is formed by a portion of the display disposed on the front surface, a support member may be disposed in at least a portion of the housing 210 so as to support the display.

According to an embodiment, various types of electric elements may be mounted in the internal space defined by the side surface 210A and the rear surface of the housing 210.

As an example, a patch antenna 212, an antenna 207, and/or a main circuit board 208 may be mounted in the internal space of the electronic device 200. According to certain embodiments, the main circuit board 208 and the antenna 207 and/or the main circuit board 208 and the patch antenna 212 may be electrically connected via the printed circuit board 300. According to an embodiment, the printed circuit board 300 may include a first area 301 that is electrically connected to the antenna 207, and may include a second area 302 branched from an area of the first area 301 and electrically connected to the patch antenna 212.

According to an embodiment, at least a portion of the patch antenna unit 212 may include a portion electrically connected to at least a portion of the printed circuit board 300 (e.g., a partial area of the second area 302) so as to be electrically connected to the main circuit board 208, and at least a portion of the patch antenna 212 may be electrically connected to at least a portion of the housing 210. According to an embodiment, the patch antenna 212 may be a microstrip patch antenna. According to an embodiment, the shape of the patch antenna may have a rectangular, square, circular, or circular ring shape. According to an embodiment, the patch antenna 212 may include an antenna made of a thin metal patch plate on at least a portion of a dielectric material that is thin and has a low loss rate or low dielectric constant.

According to an embodiment, the main circuit board 208 may include a connector 211 coupled to the printed circuit board 300, and a processor (e.g., the processor 120 in FIG. 1) and/or memory (e.g., the memory 130 in FIG. 1) may be disposed on the main circuit board 208.

A wireless communication unit 292 (e.g., the wireless communication unit 192 in FIG. 1) may be disposed on the main circuit board 208, and the wireless communication unit 292 may be electrically connected to the main circuit board 208. The wireless communication unit 292 may be electrically connected to the connector 211 on the main circuit board 208. In this case, the connector 211 may be electrically connected to the antenna 207 and/or the patch antenna 212 via the printed circuit board 300. Accordingly, the wireless communication unit 292 may be electrically connected to the antenna 207 and/or the patch antenna 212.

According to an embodiment, the wireless communication unit 292 may transmit power and/or signals to the antenna 207 and/or the patch antenna 212, or may receive signals from the antenna 207 and/or the patch antenna 212. According to another example, the wireless communication unit 292 may be configured to transmit or receive a radio signal (e.g., a radio-frequency (RF) signal (hereinafter referred to as an "RF signal") via the antenna 207 and/or the patch antenna 212.

According to an embodiment, the antenna 207 may be formed on an additional circuit board 209, and may include a power feeder 207-1, a ground 207-3, and/or a conductive member 207-2.

According to an embodiment, the power feeder 207-1 may be disposed on an area of the additional circuit board 209, and may be in contact with one point of the conductive member 207-2 so as to be electrically connected to the conductive member 207-2.

According to an embodiment, the ground 207-3 may be disposed on an area of the additional circuit board 209 to be spaced apart from the power feeder 207-1, and may be in contact with a portion other than the one point of the conductive member 207-2 so as to be electrically connected to the conductive member 207-2.

According to an embodiment, the conductive member 207-2 may form at least a portion of the side surface 210A of the housing 210. Non-conductive members are disposed at opposite ends of the conductive member 207-2, and the conductive member 207-2 may thus be in the state of being electrically separated from the remaining portion of the side surface 210A. The conductive member 207-2 electrically connected to the power feeder 207-1 may be fed with power by the power feeder 207-1 so as to operate as an antenna radiator of the antenna 207. According to certain embodiments, the conductive member 207-2 of the antenna 207 may be omitted. In this case, a component of the electronic device 200 other than the conductive member 207-2 may be used as an antenna radiator of the antenna 207.

According to an embodiment, the patch antenna 212 may include a flexible printed circuit board (not illustrated), an antenna array and/or a radio-frequency integrated circuit (RFIC) disposed on the flexible circuit board. In an example, in the antenna array, a plurality of antennas may be arranged and the beam patterns of respective antennas may be combined so that the beam patterns can be more sharply combined. The above-described patch antenna 212 may be, for example, a mmWave antenna module for 5G network communication. According to certain embodiments, in the patch antenna 212, at least one of the components described above may be omitted, or at least two of the components may be integrally formed.

The antenna array may be formed inside or on the surface of the patch antenna 212, and may include various types of antenna arrays (e.g., a patch antenna array and a dipole antenna array).

The RFIC (or an "intermediate-frequency integrated circuit (IFIC)") may be configured to process an RF signal transmitted and/or received via the antenna array. As an example, during transmission, the RFIC may convert an intermediate-frequency (IF) signal or a baseband signal obtained from the wireless communication unit 292 into a 5G Above-6 band (e.g., about 6 GHz to about 60 GHz) to be used in a 5G network of a designated band. As another example, during reception, the RFIC may convert an RF signal obtained from the antenna array into an IF signal or a baseband signal, and may provide the IF signal or the baseband signal to the wireless communication unit 292.

According to an embodiment, the printed circuit board 300 may be composed of multiple layers, and may serve as a connector for electrically connecting electric elements. According to an example, the multiple layers may include, for example, a wiring layer on which a signal wire is formed, a ground layer on which a ground is formed, and an insulating layer filling a space between the wiring layer and the ground layer, which will be described later.

According to an embodiment, a signal (e.g., an RF signal) may be transmitted or received between the wireless communication unit 292 and the antenna 207 and/or the patch antenna 212 through a signal wire of the printed circuit board 300. However, the electric elements connected by the printed circuit board 300 are not limited to the wireless communication unit 292, the antenna 207, and/or the patch antenna 212 described above, and various types of components inside the electronic device may be electrically connected via the printed circuit board 300.

According to an embodiment, the printed circuit board 300 may include one or more flexible areas (e.g., 303, 304, and 305) in order to connect electric elements (e.g., components) mounted in a narrow space inside the housing 210. Accordingly, in the process of connecting a plurality of electric elements, some portions of the printed circuit board 300 may be flexibly bent through the flexible areas.

According to another embodiment, the printed circuit board 300 may include one or more flexible area 303, 304, 305 and a rigid area 306. As an example, in the printed circuit board 300, areas adjacent to the electric elements (e.g., the main circuit board 208, the patch antenna 212, and/or the antenna 207), the flexible areas 303, 304, and 305, which are capable of being bent or curved may be disposed, and the rigid area 306, which is less flexible than the flexible areas 303, 304, and 305, may be disposed between the flexible areas 303, 304, and 305.

That is, in the printed circuit board 300 according to an embodiment, the areas adjacent to the electric elements may be formed to have a flexible characteristic so as to increase bondability between the printed circuit board 300 and the electric elements, and the remaining area may be formed to have a rigid characteristic so as to secure the rigidity of the printed circuit board 300. However, a description of a configuration for making the printed circuit board 300 have the flexible characteristic and/or the rigid characteristic will be described in detail below.

According to an embodiment, the printed circuit board 300 may be formed only as a flexible area without being divided into flexible areas 303, 304, and 305 and a rigid area 306. According to an embodiment, in the printed circuit board 300, an area to be connected to a circuit board (e.g., the main circuit board 208 or the additional circuit board 209) or an electric element (e.g., the patch antenna 212) may be formed as a rigid area, and the remaining may be configured as a flexible area.

Figure 3A:
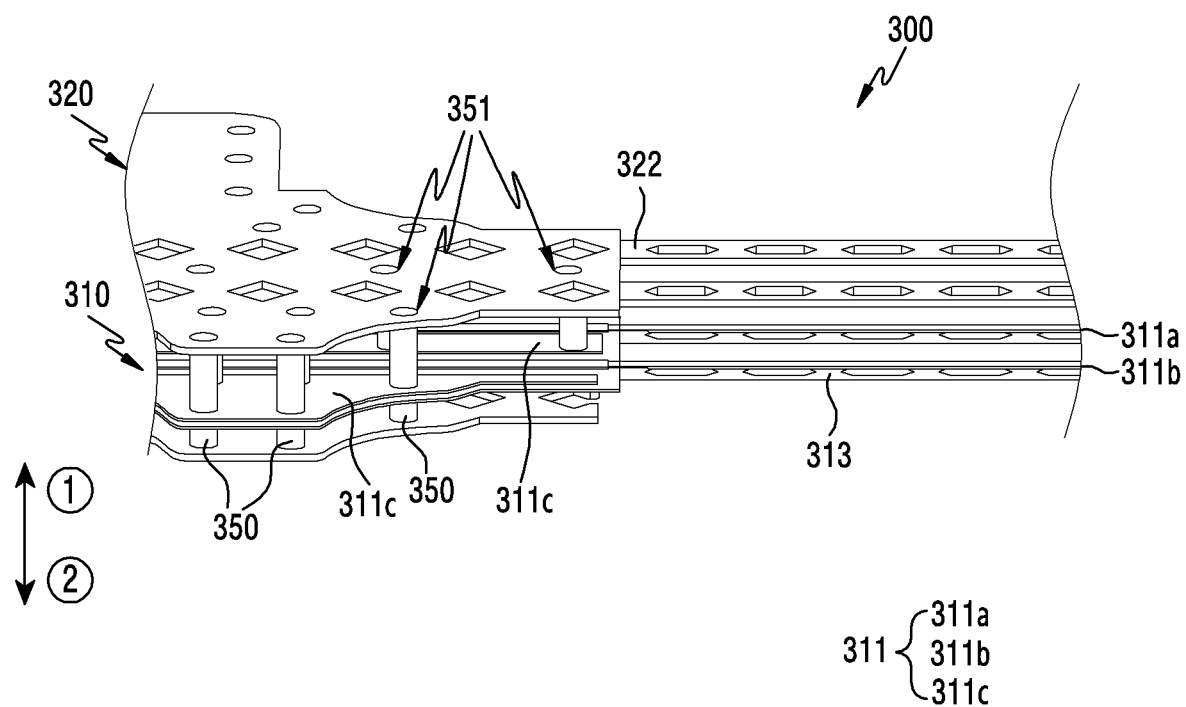
FIG. 3A is a perspective view of a printed circuit board included in an electronic device according to certain embodiments when the printed circuit board is viewed from the top side thereof.
Figure 3B:
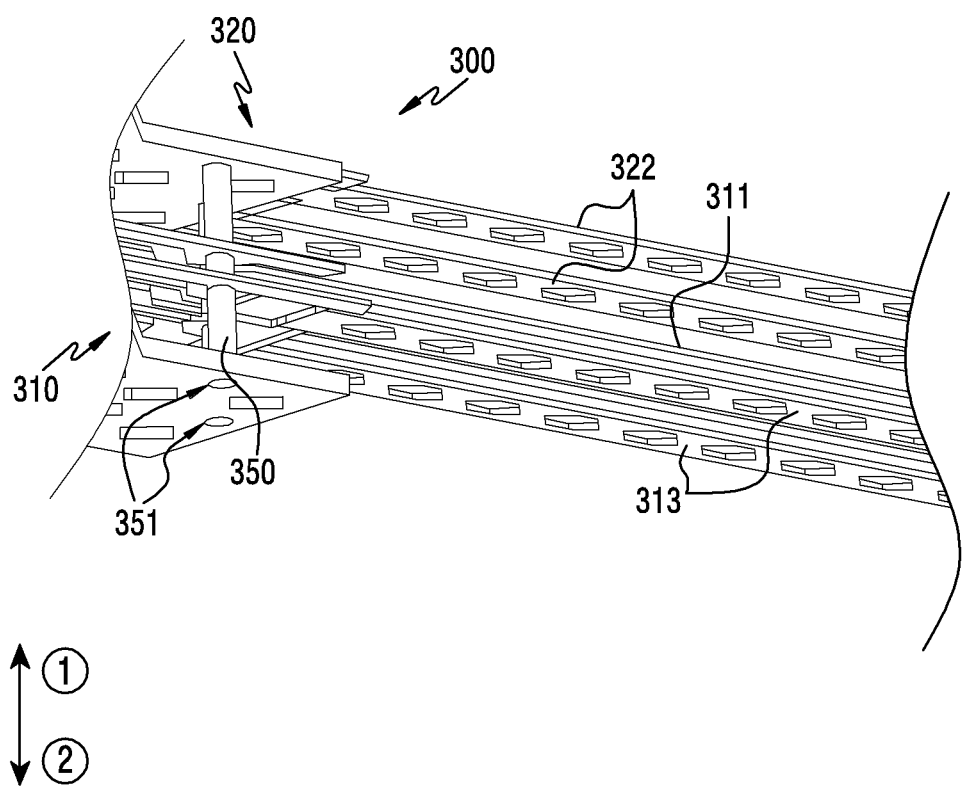
FIG. 3B is a perspective view of a printed circuit board included in an electronic device according to certain embodiments when the printed circuit board is viewed from the bottom side thereof.

FIG. 3A is a perspective view when a printed circuit board (e.g., the printed circuit board 300 in FIG. 2A or the printed circuit board 300 in FIG. 2B) included in an electronic device (e.g., the electronic device 102 in FIG. 1, the electronic device 200 in FIG. 2A, and/or the electronic device 200 in FIG. 2B) is viewed from the top side thereof (e.g., in the direction ① in FIG. 3A), and FIG. 3B is a perspective view when the printed circuit board included in an electronic device according to certain embodiments is viewed from the bottom side thereof (e.g., in the direction ② in FIG. 3A). The perspective views illustrated in FIGS. 3A and 3B illustrate portions through which current can flow, except for an insulating layer.

Referring to FIGS. 3A and 3B, according to certain embodiments, the printed circuit board 300 may include a first printed circuit board 310 and a second printed circuit board 320. The second printed circuit board 320 creates space between the signal wires 311*a* and 311*b*, thereby preventing signal loss at high frequencies.

According to an embodiment, the first printed circuit board 310 may include multiple layers. As an example, the first printed circuit board 310 may include a first ground layer 313, a wiring layer 311, and at least one insulating layer (not illustrated).

In an example, the wiring layer 311 may include at least one signal wires 311a and 311b and a metal member 311c spaced apart from the one or more signal wires 311a and 311b, and a ground may be disposed on the first ground layer 313. The at least one insulating layer may be disposed between the first ground layer 313 and the wiring layer 311 so as to insulate the areas of the first ground layer 313 and the wiring layer 311 from each other.

According to an embodiment, the second printed circuit board 320 may have a multi-layer structure including at least one insulating layer (not illustrated) and a third ground layer 322. In an example, at least one opening may be formed in the third ground layer 322, and the at least one insulating layer may be disposed in an area adjacent to the third ground layer 322 (e.g., the upper end area and/or the lower end area of the third ground layer 322) so as to insulate the third ground layer 322. A detailed description of at least one opening and/or via hole 351 formed in the first ground layer 313 and/or the third ground layer 322 will be described later. The second printed circuit board 320 is, for example, disposed above the first printed circuit board 310 to be spaced apart from the first printed circuit board 320 such that the signal wire of the first printed circuit board 310 does not come into contact with nor interfere with another conductor (e.g., metal).

According to an embodiment, at least one via hole 351 may be formed in the first ground layer 313 and the third ground layer 322. In addition, for example, at least one via hole 351 may penetrate the first ground layer 313 and the third ground layer 322, which may be electrically connected to each other through at least one via 350 including a conductive material. For example, the first ground layer 313 and the third ground layer 322 may have the same potential or similar potentials via at least one via 350, and as a result, it is possible to stably set reference potential. Thus, it is possible to form a stable ground.

In certain embodiments, the printed circuit board 300 may be included in the electronic device 101 in FIG. 1, the electronic device 200 in FIG. 2A, and/or the electronic device 200 in FIG. 2B. The above-described electronic device may include components that are in charge of various functions, and at least some of the components may be implemented in one integrated circuit. According to certain embodiments, the printed circuit board 300 may provide a signal wire to an electronic device (e.g., the electronic device 102 of FIG. 1, the electronic device 102 of FIG. 2A, and/or the electronic device 200 in FIG. 2B) such that the circuits in which respective components included in the electronic device are implemented can be electrically connected to each other.

In an embodiment, the electronic device may include a communication circuit. In an example, during signal transmission, the communication circuit may up-convert a baseband signal produced by a communication processor into a radio-frequency (RF) signal used in a wireless network. In another example, during signal reception, the communication circuit may pre-process an RF signal obtained from a wireless network through the antenna, and may convert the RF signal into a baseband signal so as to be capable of being processed by the communication processor. In this case, an RF signal wire for transmitting an RF signal is required between the communication circuit and the antenna, and according to an embodiment, the printed circuit board 300 may provide an RF signal wire for RF signal transmission (e.g., transmission/reception).

In an embodiment, an electronic device may include a communication circuit capable of supporting a frequency band used in a 5G network, and the communication circuit may up-convert the baseband signal processed by the communication processor into an RF signal of a 5G Above-6 band (e.g., about 6 GHz to about 60 GHz) (hereinafter, referred to as a "5G Above-6 RF signal") to be used in a 5G network. According to an embodiment, the printed circuit board 300 (e.g., the printed circuit board 300 in FIGS. 2A and 2B) may provide an RF signal wire for transmitting the converted 5G Above-6 RF signal from a communication circuit to an antenna.

In an embodiment, the electronic device (e.g., the electronic device 200 in FIG. 2A) may include a foldable housing (e.g., the foldable housing 203 in FIG. 2A) including at least two housings (e.g., the first housing 201 and the second housing 202 in FIG. 2A) and a connector (e.g., a hinge structure) connecting the two housings to each other. Since the at least two housings are rotatably operated by a connector, the electronic device may have a foldable structure that is switched from a folded state to an unfolded state or from an unfolded state to a folded state. In this case, a circuit board on which components for implementing various functions of the electronic device are mounted may be disposed inside each of the at least two housings, and the connector may include a hinge structure including a conductor (e.g., metal) and a wiring member extending across the connector.

In an example, the wiring member may include a signal wire capable of transmitting signals between components on the circuit boards disposed in at least two housings, and the signal wire may be disposed such that interference of a signal, which may be generated from the conductor (e.g., metal) included in the hinge structure, with the signal wire can be minimized or the signal wire is not interfered with the signal. Further, at least a portion of the wiring member may be formed to be flexible such that the wiring member can be suitably used in a folding area.

That is, according to an exemplary embodiment, the printed circuit board 300 may provide a signal wire including a flexible portion that is free from interference of a conductor and can be used in a folding area. However, a description of the specific structure of a signal wire having the effects described above will be described later.

In an embodiment, the electronic device may include one foldable housing including an at least partially bendable area. The electronic device may have a foldable structure so as to be switched from the folded state to the unfolded state or from the unfolded state to the folded state using the at least partially bendable area. For example, one foldable housing (e.g., the foldable housing 203 in FIG. 2A) may be divided into a plurality of areas based on the at least partially bendable area. A circuit board on which components for implementing various functions of the electronic device are mounted may be disposed in each area of the foldable housing divided by the bendable area. In addition, a wiring member may be disposed inside the foldable housing to extend from one area of the foldable housing divided by the bendable area to another area of the foldable housing across the bendable area.

In an example, the wiring member may include a signal wire capable of transmitting a signal between components disposed in respective areas of the foldable housing divided based on the at least partially bendable area, and the signal wire may be configured such that inference of a signal, which may be generated from a conductor (e.g., metal) in the at least partially bendable area, with the signal wire can be minimized or the signal wire is not interfered with the signal. However, a description of the specific structure of a signal wire having the effects described above will be described later.

Figure 4A:
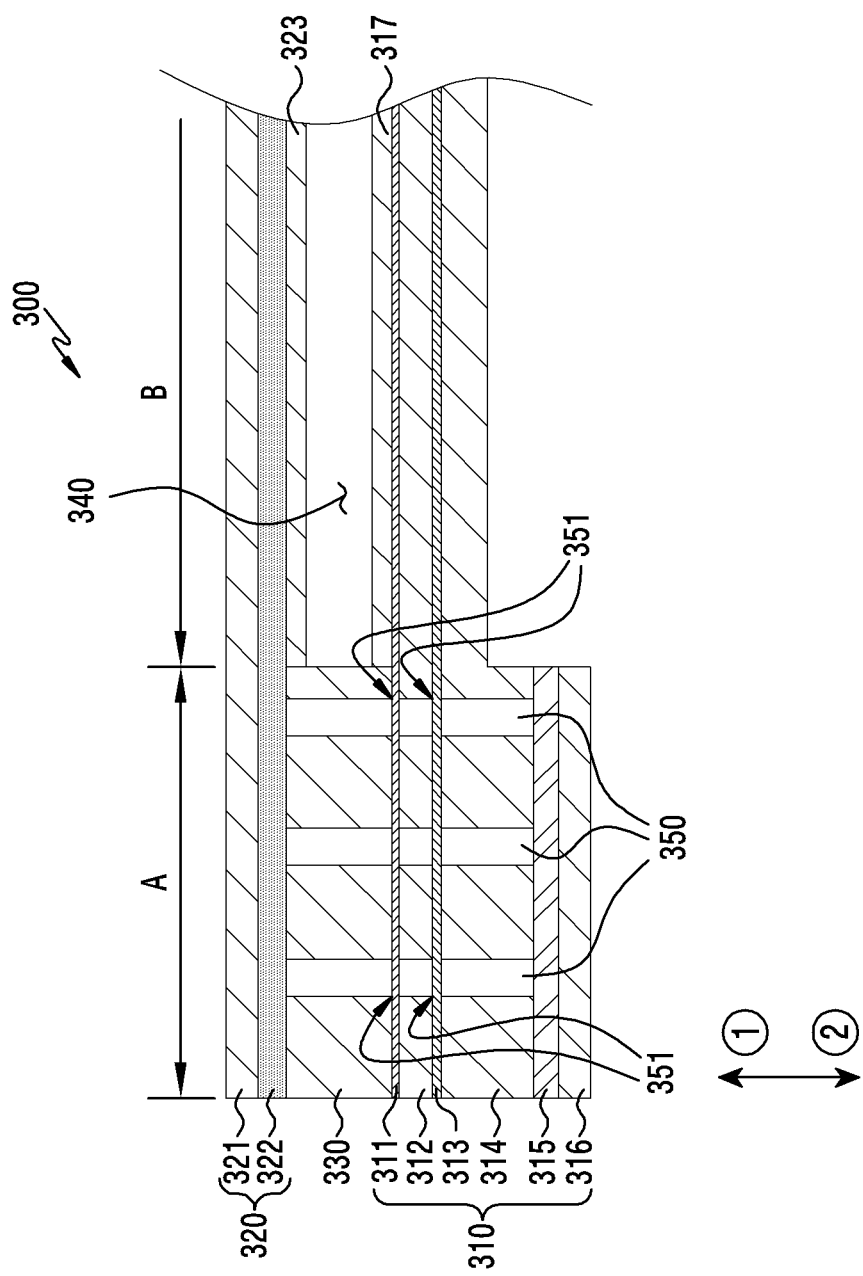
FIG. 4A is a side view of a printed circuit board included in an electronic device according to certain embodiments.

FIG. 4A is a side view of a printed circuit board (e.g., the printed circuit board 300 in FIGS. 3A and 3B) included in an electronic device (e.g., the electronic device 200 in FIGS. 2A and 2B) according to certain embodiments.

The printed circuit board 300 includes a first printed circuit board 310 and a second printed circuit board 320. The first printed circuit board 310 includes a ground layer 313, a first one or more openings 351, and a wiring layer 311. The second printed circuit board 320 includes a ground layer 322. In a first area A, the first printed circuit board 310 and the second printed circuit board 320 are connected via an insulation layer 330. In the second area B, the first printed circuit board and the second printed circuit board are separated. The second area B can also be flexible. As a result, the second area B can be disposed near the hinge cover of a housing. Since the second printed circuit board 320 is not connected to the first printed circuit board in the second area B, a separation is created between the first printed circuit board 310 and the hinge cover. The separation reduces signal loss at higher frequencies.

Referring to FIG. 4A, according to certain embodiments, the printed circuit board 300 may include a first printed circuit board 310 (e.g., the first printed circuit board 310 in FIGS. 3A and 3B) and a second printed circuit board 320 (e.g., the second printed circuit board 320 in FIGS. 3A and 3B) may be included. According to certain embodiments, the printed circuit board 300 may be divided into a first area A and a third area (not illustrated) in which an insulating layer 330 is interposed between the first printed circuit board 310 and the second printed circuit board 320, and a second area B, which extends from the first area A toward the third area (not illustrated), and in which an air layer 340 is interposed between the first printed circuit board 310 and the second printed circuit board 320. FIG. 4A is a cross-sectional view of a portion of the first area A and the second area B of the printed circuit board 300 according to certain embodiments. According to an embodiment, the third area (not illustrated) may be formed in a structure that is the same as or similar to that of the first area A. In an example, the third area may be disposed in an area (e.g., one terminal end) of the printed circuit board so as to be electrically connected to another circuit board (e.g., the first printed circuit board 205 or the second printed circuit board 206 in FIG. 2A) via at least a portion of the printed circuit board 300.

In certain embodiments, the first printed circuit board 310 may be formed in a multilayer structure, and a partial area of the first printed circuit board 310 corresponding to the first area A (or the third area) and another partial area of the first printed circuit board 310 corresponding to the second area B may have different multilayer structures. In an example, the first printed circuit board 310 may have a micro-strip line structure including a wiring layer 311, a first insulating layer 312, and a first ground layer 313 from above (e.g., in the direction from $\hat{1}$ to $\hat{2}$ in FIG. 4A) irrespective of the above-described areas.

In an example, the wiring layer 311 may be disposed on the first insulating layer 312, and a signal wire may be formed on the wiring layer 311. The signal wire is not limited to the illustrated shape. According to certain embodiments, the signal wire may be designed in various ways to have, for example, a thickness, a width, or a shape adjusted according to the frequency characteristic of a transmitted signal.

In an example, the first ground layer 313 may be formed by patterning a metal layer under the first insulating layer 312 to have one or more openings. In this case, the one or more openings formed in the first ground layer 313 may be formed in various shapes (e.g., a rhombus shape, an ellipse shape, a quadrangular shape, and a hexagonal shape). In an example, the one or more openings may be arranged at regular intervals in the first ground layer 313, but according to another embodiment, the one or more openings may be arranged at irregular intervals in the first ground layer 313. However, a detailed description of the one or more openings will be described later.

However, the shape of the first ground layer 313 is not limited to the above-described embodiment. According to another embodiment, the first ground layer 313 may be formed as a metal layer having a predetermined thickness without a separate pattern.

According to an embodiment, the first printed circuit board 310 may further include a second insulating layer 314. In an example, the second insulating layer 314 may be disposed below the first ground layer 313 (e.g., in the direction $\hat{2}$ in FIG. 4A) so as to insulate the first ground layer 313 together with the first insulating layer 312.

According to an embodiment, a partial area of the first printed circuit board 310 corresponding to the first area A (or the third area) may further include at least one third insulating layer 316 and/or a second ground layer 315 disposed between the second insulating layer 314 and the third insulating layer 316 in addition to the second insulating layer 314. The second insulating layer 314 and the third insulating layer 316 may insulate the second ground layer 315, and at least one via hole may be formed in the first ground layer 313 and the second ground layer 315. At least one via hole 351 may penetrate the first ground layer 313 and the second ground layer 315, which may be electrically connected via at least one via 350 including a conductive material. For example, the first ground layer 313 and the second ground layer 315 may have the same potential or similar potentials via at least one via 350, and as a result, it is possible to stably set reference potential. Thus, it is possible to form a stable ground.

According to an embodiment, a partial area of the first printed circuit board 310 corresponding to the second area B may further include a fourth insulating layer 317. In an example, the fourth insulating layer 317 may be positioned on the wiring layer 311 corresponding to the second area B (e.g., in the direction $\hat{1}$ in FIG. 4A) to insulate the wiring layer 311.

In an embodiment, the wiring layer 311 may include signal wires (e.g., the signal wires 311a and 311b in FIG. 3A, signal wire 311 in FIG. 3B). Further, in an example, the wiring layer 311 may include at least one metal member (e.g., the metal member 311c in FIG. 3A). Since the at least one metal member is disposed to be spaced apart from, for example, the signal wires, the metal member does not come into direct contact with the signal wires, and at least one via hole 351 may be formed in the at least one metal member. The at least one via 350 may pass through, for example, the at least one via hole 351 formed in the metal member and may electrically connect the first ground layer 313 and the second ground layer 315 to each other without interfering with the signal wires. In addition, the at least one via 350 may pass through, for example, the at least one via hole 351 formed in the metal member, and may electrically connect the first ground layer 313 and the third ground layer 322 (e.g., the third ground layer 322 of the second printed circuit board 320) to each other without interfering with the signal wires.

In certain embodiments, the second printed circuit board 320 may be formed in a multilayer structure, and may include a fifth insulating layer 321 and a third ground layer 322. The third ground layer 322 may be formed by, for example, patterning a conductive layer (e.g., a metal layer) under the fifth insulating layer 321 to have at least one opening therein. According to an example, a lower conductive layer (e.g., a metal layer) of the fifth insulating layer 321 may be patterned such that one or more openings having the same shape or similar shapes may be formed in the third ground layer 322. The one or more openings may be formed in various shapes (e.g., a rhombus shape, a quadrangular shape, a hexagonal shape, and an elliptical shape, a mesh shape) according to embodiments. In an example, the one or more openings may be arranged at regular intervals in the third ground layer 322, but according to another embodiment, the one or more openings may be arranged at irregular intervals in the third ground layer 322. That is, the one or more openings may be differently arranged depending on the area and/or distance in which the openings are formed. For example, the one or more openings may be arranged at a first interval in an area of the third ground layer 322 corresponding to the first area A, and may be arranged at a second interval, which is different from the first interval, in an area of the third ground layer 322 corresponding to the second area B.

According to an embodiment, in a portion corresponding to the second area B, the third ground layer 322 may have a mesh pattern in which the one or more openings are continuously arranged. The above-described mesh pattern may be designed by adjusting the shape and/or the pitch of the openings so as to minimize the influence of the third ground layer 322 on the impedance of the signal wire formed on the wiring layer 311.

The impedance value of the printed circuit board 300 is determined according to the characteristics of signals transmitted through the signal wires. When the overlapping area between the third ground layer 322 and the wiring layer 311 varies, the impedance value of the printed circuit board 300 may be affected. Specifically, as the overlapping area between the third ground layer 322 and the wiring layer 311 increases, the capacitance value C between the third ground layer 322 and the wiring layer 311 may increase.

According to an embodiment, in order to minimize the influence of the third ground layer 322 and the wiring layer 311 on the impedance value of the printed circuit board 300, the one or more openings formed in the third ground layer 322 may have a width that is greater than that of the signal wire of the wiring layer 311, or may have a width that is the same as or similar to that of the signal wire according to embodiments. In the area of the third ground layer 322 in which the one or more openings are arranged, it is possible to minimize the overlapping area between the wiring layer 311 and the third ground layer 322, and to reduce the capacitance value between the third ground layer 322 and the wiring layer 311.

When the capacitance value between the third ground layer 322 and the wiring layer 311 decreases, the impedance value of the printed circuit board 300 may increase. According to an exemplary embodiment, in the printed circuit board 300, it is possible to reduce the conductor loss (e.g., resistance R or inductance L) of the signal wire by increasing the area or width of the wiring layer 311 on which the signal wire is disposed, whereby it is possible to maintain the impedance value while reducing the capacitance value between the third ground layer 322 and the wiring layer 311. However, a detailed description of the shape of the one or more openings will be described later.

According to an embodiment, in a portion of the second printed circuit board 320 corresponding to the first area A (or the third area), the third ground layer 322 may be electrically connected to ground layers of the first printed circuit board 310 (e.g., the first ground layer 313 and the second ground layer 315) via one or more vias 350 including a conductive material. According to certain embodiments, all of the ground layers (e.g., the first ground layer 313, the second ground layer 315, and the third ground layer 322) included in the printed circuit board 300 may be electrically connected to each other via the one or more vias 350 so as to have the same potential or similar potentials. As a result, it is possible to set the reference potential to be low, and thus to form a stable ground.

According to an embodiment, a partial area of the second printed circuit board 320 corresponding to the second area B may further include a sixth insulating layer 323. For example, the sixth insulating layer 323 may be disposed under the area of the third ground layer 322 corresponding to the second area B (e.g., in the direction ② in FIG. 4A), and may insulate the third ground layer 322 together with the fifth insulating layer 321 disposed on the third ground layer 322.

According to certain embodiments, in the printed circuit board 300, the second printed circuit board 320 may be disposed on the first printed circuit board 310. For example, the wiring layer 311 of the first printed circuit board 310 and the second ground layer 322 of the second printed circuit board 320 may be disposed to face each other at a predetermined distance. When a conductor (e.g., metal) approaches the wiring layer 311 or when a conductor comes into contact with the wiring layer 311, the signal wire disposed on the wiring layer 311 may be affected by the conductor. As an example, the impedance and/or loss of the signal wire may increase according to the approach or contact of the conductor. According to an embodiment, in the printed circuit board 300, by disposing the second printed circuit board 320 on the first printed circuit board 310, it is possible to suppress the increase of the impedance and/or the loss of the signal wire even when a conductor approaches the signal wire.

In certain embodiments, an insulating layer 330 may be interposed between the first printed circuit board 310 and the second printed circuit board 320 in the first area A (or the third area). In addition, the first printed circuit board 310, the second printed circuit board 320, and the insulating layer 330 may include, in the first area A (or the third area), one or more via holes 351 through which one or more respective via holes 350 pass.

In one example, the first area A (or the third area) of the printed circuit board 300 may include one or more vias 350, but the second area B of the printed circuit board 300 does not include a via. Thus, the first area A (or the third area) of the printed circuit board 300 has stronger rigidity than the second area B, and the second area B can be more flexible than the first area A (or the third area) and can be easily deformed (e.g., bent or curved).

However, the structure of the printed circuit board 300 is not limited to the above-described embodiment. In another example (not illustrated), when the first printed circuit board 310 of the printed circuit board 300 is formed in a multilayer board structure, not only the first area A (or the third area) but also the second area B may include one or more vias 350.

In certain embodiments, in the second area B of the printed circuit board 300, an air layer 340 may be interposed between the first printed circuit board 310 and the second printed circuit board 320. For example, in the second area B, there may be no solid interposed between the first printed circuit board 310 and the second printed circuit board 320.

Since the air layer is interposed between the first printed circuit board 310 and the second printed circuit board 320 in the second area B, the first area A (or the third area) and the second area B of the printed circuit board 300 having the insulating layer 330 between the first printed circuit board 310 and the second printed circuit board 320 may have different properties. For example, when compared to the second area B, the first area A (or the third area) may have stronger rigidity, and the second area B is more flexible than the first area A (or the third area) and is more easily deformable.

In certain embodiments, the second area B of the printed circuit board 300 may be thinner than the first area A (or the third area) of the printed circuit board 300. For example, the first area (A) (or the third area) of the printed circuit board 300 may further include more ground layers and/or insulating layers than the second area B of the printed circuit board 300, and may thus be thicker than the second area B.

Figure 4B:
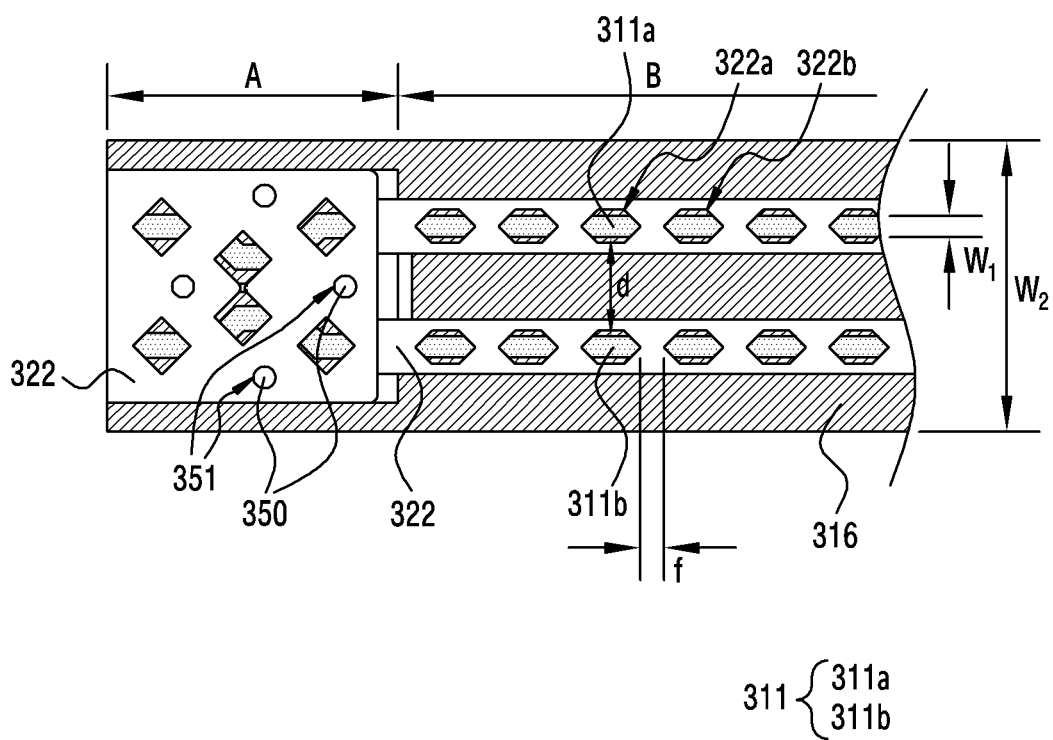
FIG. 4B is a top plan view of a printed circuit board included in an electronic device according to an embodiment.
Figure 4C:
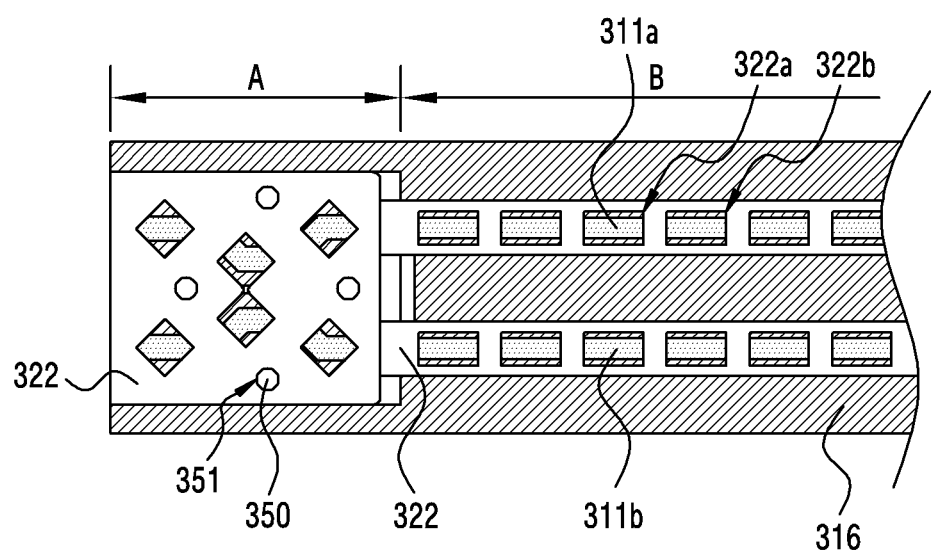
FIG. 4C is a top plan view of a printed circuit board included in an electronic device according to another embodiment.
Figure 4D:
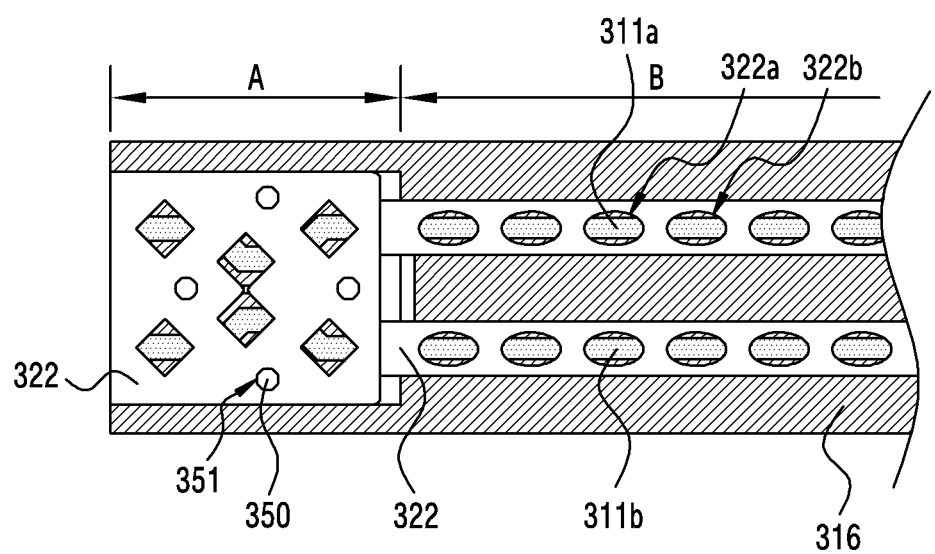
FIG. 4D is a top plan view of a printed circuit board included in an electronic device according to still another embodiment.
Figure 4E:
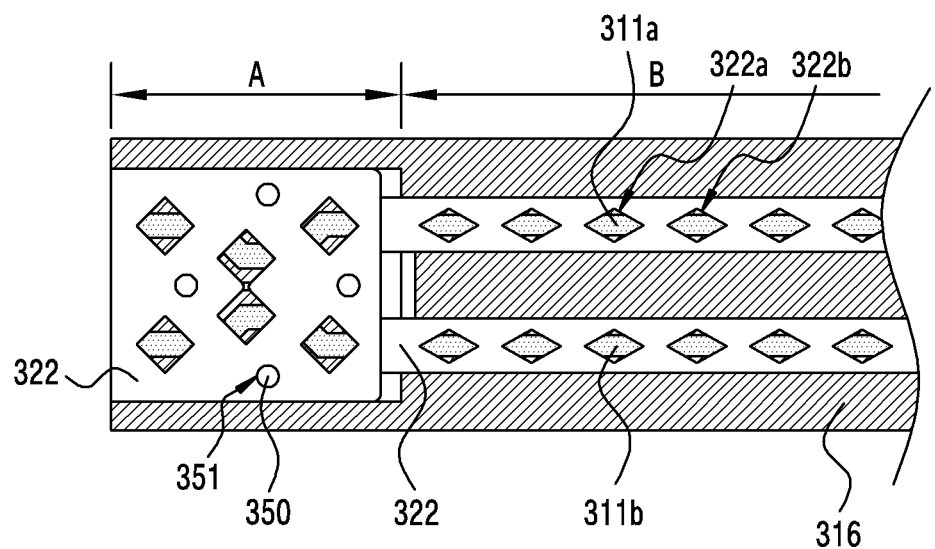
FIG. 4E is a top plan view of a printed circuit board included in an electronic device according to yet another embodiment.

FIG. 4B is a top plan view of a printed circuit board included in an electronic device according to certain embodiments, FIG. 4C is a top plan view of a printed circuit board included in an electronic device according to another embodiment, FIG. 4D is a top plan view of a printed circuit board included in an electronic device according to still another embodiment, and FIG. 4E is a top plan view of a printed circuit board included in an electronic device according to yet another embodiment. The top plan views illustrated in FIGS. 4B to 4E are perspective views mainly showing portions, through which current can flow, other than insulating layers (e.g., 330, 312, and 314 in FIG. 4A), and showing portions of the first area A and the second area B in the printed circuit board 300.

Referring to FIG. 4B, according to certain embodiments, the printed circuit board 300 may include a wiring layer 311 (e.g., the wiring layer 311 in FIG. 4A) on which at least two signal wires 311a and 311b are disposed, and a third ground layer 322 (e.g., the third ground layer 322 in FIG. 4A) disposed above the wiring layer 311 to be spaced apart therefrom. In the illustrated embodiment, the signal wires 311a and 311b included in the wiring layer 311 have a line shape, and are arranged side by side and are spaced apart from the second area B of the printed circuit board 300 at a predetermined interval d. However, the shape of the signal wires 311a and 311b is not limited to the above-described line shape, and the signal wires 311a and 311b may have various forms capable of improving transmission performance.

In an example, an insulating layer (e.g., the fourth insulating layer 317 in FIG. 4A) may disposed on the wiring layer 311 corresponding to the second area B so as to insulate the wiring layer 311. However, the disclosure is not limited to the above-described embodiment. According to another embodiment, a protective layer (e.g., an insulating layer) for protecting or insulating the wiring layer 311 may not be formed in at least one area of the wiring layer 311. For example, an insulating layer may be formed on the first signal wire 311a included in the wiring layer 311, but no insulating layer may be formed on the second signal wire 311b, so that the second signal wire 311b may be exposed to the air. As another example, an insulating layer may be formed on the second signal wire 311b, but no insulating layer may be formed on the first signal wire 311a, so that the first signal wire 311a may be exposed to the air.

According to an embodiment, at least a partial area of the wiring layer 311 including the signal wires 311a and 311b may be processed to form a coating layer thereon in order to block noise. In an example, a partial area (e.g., the first signal wiring 311a) on which the coating layer of the wiring layer 311 is formed may be formed to be exposed to the air.

According to an embodiment, the distance between the signal wires 311a and 311b may be changed in the first area A (or the third area) of the printed circuit board 300, unlike in the second area B.

In certain embodiments, in order to protect the signal wires 311a and 311b, a second printed circuit board 320 may be disposed to be spaced apart from the wiring layer 311, on which the at least two signal wires 311a and 311b are formed, in a first direction (e.g., the direction ① in FIG. 4A). The second printed circuit board 320 may include a third ground layer 322 (e.g., the third ground layer 322 in FIG. 4A), and as illustrated, the third ground layer 322 may be disposed above the signal wires 311a and 311b to be spaced apart from the signal wires 311a an 311b. According to an embodiment, at least a partial area of the third ground layer 322 may be formed to at least partially overlap the signal wires 311a and 311b when the printed circuit board 300 is viewed from above (e.g., in the direction ① in FIG. 4A).

In certain embodiments, the third ground layer 322 may include openings (e.g., openings 322a and 322b). For example, the openings may include first openings 322a and/or second openings 322b. In an example, the first openings 322a and the second openings 322b may be spaced apart from each other at a predetermined interval (e.g., f in FIG. 4B), and the first openings 322a and/or the second openings 322b may be arranged in a mesh pattern. For example, the mesh pattern may include a structure in which the first openings 322a and/or the second openings 322b are alternately arranged at a predetermined interval. However, the disclosure is not limited thereto, and the first openings 322a and/or the second openings 322b may be arranged at irregular intervals according to embodiments.

In certain embodiments, the openings in the third ground layer 322 (e.g., the openings 322a and 322b in FIG. 4B) are differently arranged in the first area A (or the third area) and the second area B. For example, in order to minimize the influence of the third ground layer 322 and the wiring layer 311 on the impedance value of the printed circuit board 300, the openings in the first area A (or the third area) and the openings in the second area B (e.g., the openings 322a and 322b) may be formed in different forms (e.g., shapes).

According to an embodiment, the signal wire of the first area A (or the third area) may be arranged in consideration of at one or more vias 350 penetrating the via holes 351 in the third ground layer 322, and the signal wires of the second area B (e.g., signal wires 311a and 311b in FIG. 4B) may have different forms (e.g., shapes). Thus, according to an embodiment, the signal wires of the first area A (or the third area) and the second area B may be different from each other, and the shape of the openings in the first area A (or the third area) (e.g., a rhombus shape or a quadrangular shape) and the shape of the openings (e.g., the openings 322a and 322b) in the second area B (e.g., a hexagonal shape) may be different from each other. In an example (e.g., see FIG. 4B), the third ground layer 322 corresponding to the second area B may be larger than the width W1 of the signal wires 311a and 311b, and may be smaller than the width W2 of the printed circuit board 300 (e.g., the width of the third insulating layer 316). In addition, the third ground layer 322 may include a mesh pattern in which openings 322a and 322b having the same shape or similar shapes along the signal wires 311a and 311b are continuously and repeatedly arranged at predetermined intervals. The mesh pattern formed on the third ground layer 322 may be designed by adjusting the forms (e.g., the shapes, widths, and lengths) of the openings 322a and 322b and the pitch (e.g., the interval between the openings 322a and 322b) such that the influence of the third ground layer 322 on the impedance of the signal wires 311a and 311b disposed on the wiring layer 311 can be minimized. Although not illustrated in the drawings, according to another embodiment, the openings 322a and 322b formed in the third ground layer 322 may be arranged at irregular intervals.

As described above, the impedance value of the printed circuit board 300 is determined according to the characteristics of the signals transmitted through the signal wires 311a and 311b. When the overlapping area between the third ground layer 322 and the wiring layer 311 varies, the impedance value of the printed circuit board 300 may be affected. Specifically, as the overlapping area between the third ground layer 322 and the wiring layer 311 on which the signal wires 311a and 311b are disposed increases, the capacitance value between the third ground layer 322 and the wiring layer 311 may increase.

According to an embodiment, in order to minimize the influence of the third ground layer 322 and the wiring layer 311 on the impedance value of the printed circuit board 300, the openings 322a and 322b formed in the third ground layer 322 may have widths that are greater than those of the signal wires 311a and 311b of the wiring layer 311, or may have the same width as the signal wires (not illustrated). Accordingly, in the area of the third ground layer 322 in which the openings 322a and 322b are formed, it is possible to minimize the overlapping area between the wiring layer 311 and the third ground layer 322, and to reduce the capacitance value between the third ground layer 322 and the wiring layer 311.

However, when the capacitance value between the third ground layer 322 and the wiring layer 311 decreases, the impedance value of the printed circuit board 300 may increase. According to an exemplary embodiment, in the printed circuit board 300, it is possible to reduce the conductor loss (e.g., resistance R or inductance L) of the signal wire by increasing the area or width of the wiring layer 311 on which the signal wires 311a and 311b are disposed, whereby it is possible to maintain the impedance value to be constant while reducing the capacitance value between the third ground layer 322 and the wiring layer 311.

When the mesh pattern is formed on the third ground layer 322, it is possible not only to block the influence that may affect the impedance of the signal wires 311a and 311b since the signal wires 311a and 311b and the third ground layer 322 form a capacitor, for example, when there is no mesh pattern, but also to obtain an advantage in that the printed circuit board 300 can be more flexible.

In an example (e.g., see FIG. 4B), the openings 322a and 322b may be formed in a hexagonal shape, and may be arranged in the third ground layer 322 at regular or irregular intervals. However, the shapes of the openings 322a and 322b are not limited to the above-described embodiment, and the openings 322a and 322b may be designed differently in shape according to embodiments. For example, the openings 322a and 322b according to an embodiment (e.g., see FIG. 4C) may have a quadrangular shape, and the openings 322a and 322b according to another embodiment (e.g., see FIG. 4D) may have a circular shape or an elliptical shape. The openings 322a and 322b according to another embodiment (e.g., FIG. 4E) may have a rhombus shape, and although not illustrated in the drawings, as an example, the first openings 322a and the second openings 322b may have different shapes (e.g., a rhombus shape and an elliptical shape).

In certain embodiments, the first area A (or the third area) of the printed circuit board 300 may include one or more vias 350, but the second area 202 of the printed circuit board 200 does not include a via. Thus, the first area A (or the third area) has stronger rigidity than the second area B, and the second area B can be more flexible than the first area A (or the third area) and can be easily bent. According to another embodiment, one or more vias 350 may be formed in the second area B of the printed circuit board 300, but a redundant description thereof will be omitted.

Figure 5A:
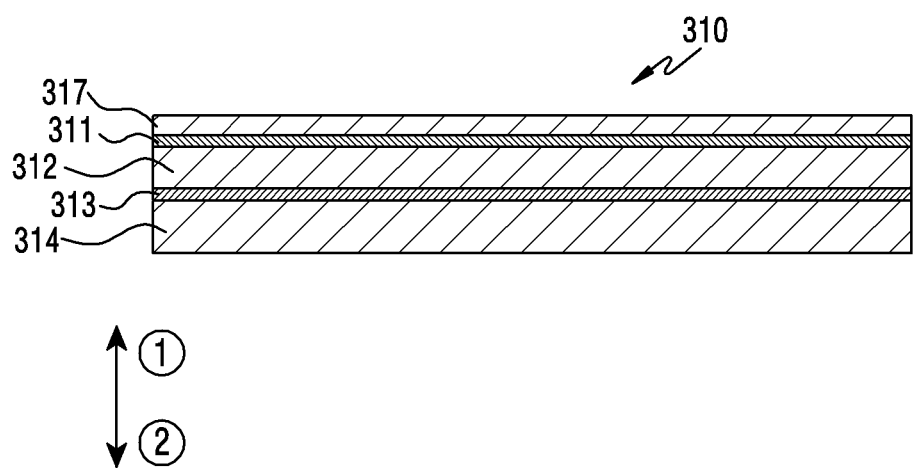
FIG. 5A is a side view illustrating a first printed circuit board included in a printed circuit board according to an embodiment.
Figure 5B:
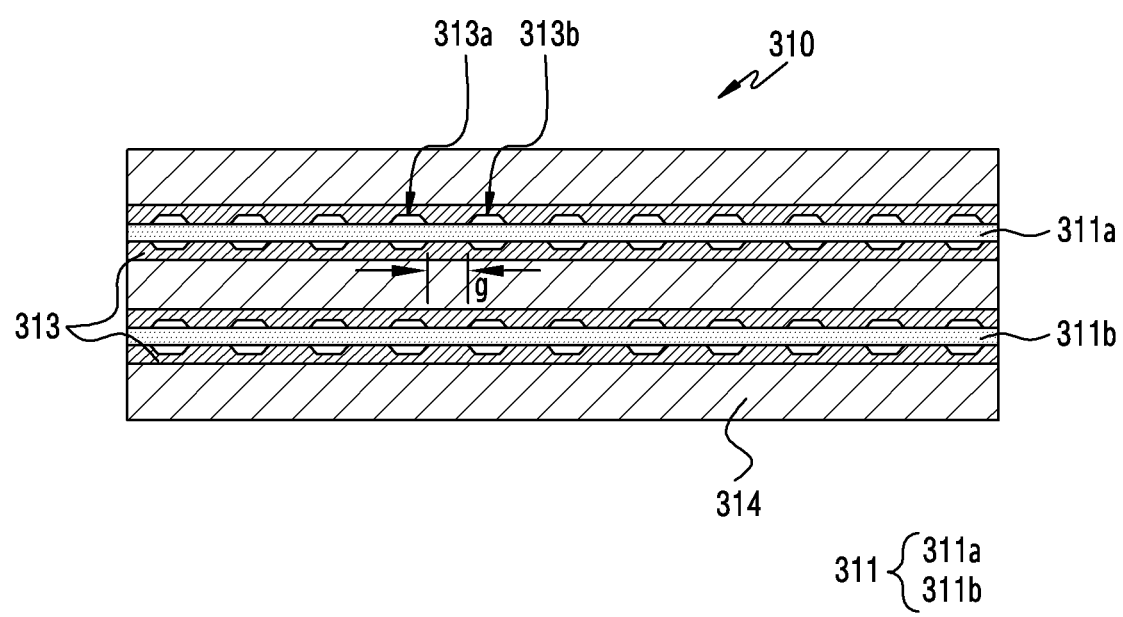
FIG. 5B is a top plan view illustrating the first printed circuit board included in the printed circuit board according to an exemplary embodiment.
Figure 5C:
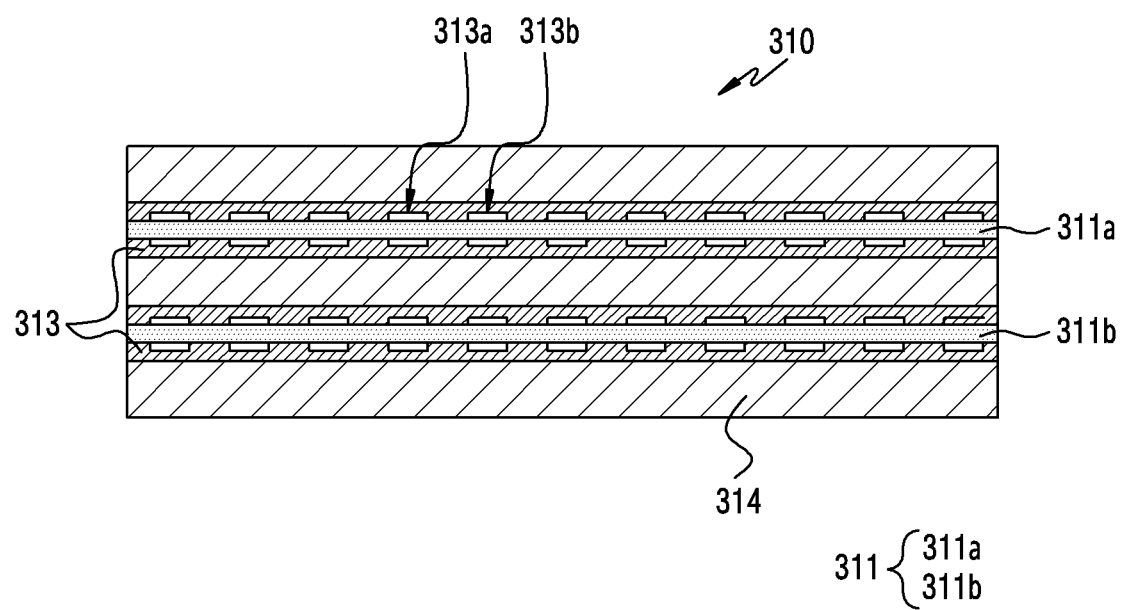
FIG. 5C is a top plan view illustrating the first printed circuit board included in a printed circuit board according to another embodiment.
Figure 5D:
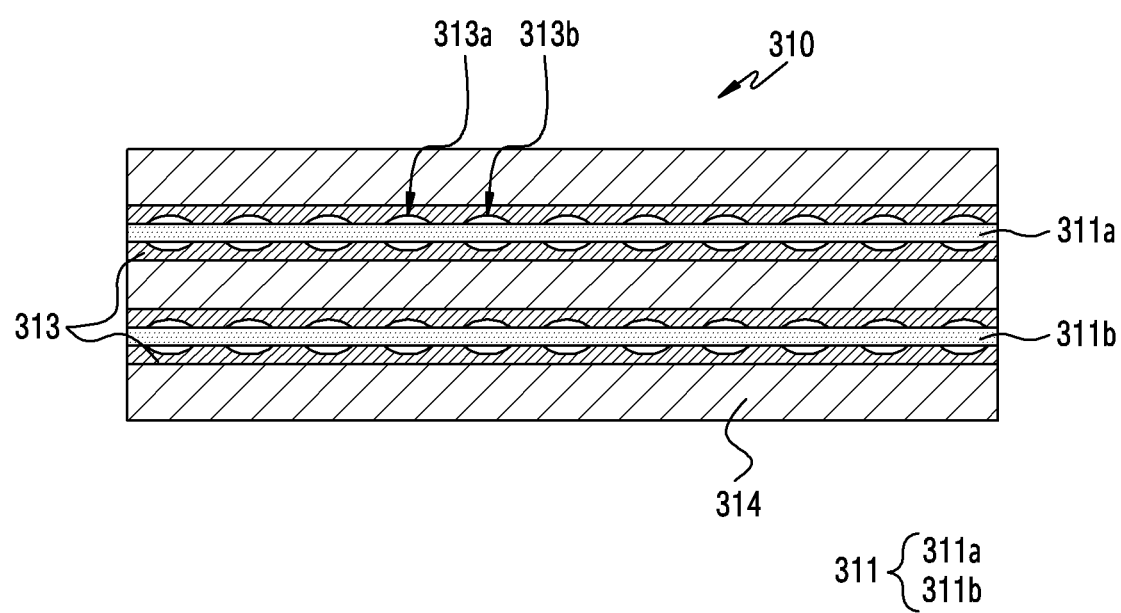
FIG. 5D is a top plan view illustrating first printed circuit board included in a printed circuit board according to another embodiment.
Figure 5E:
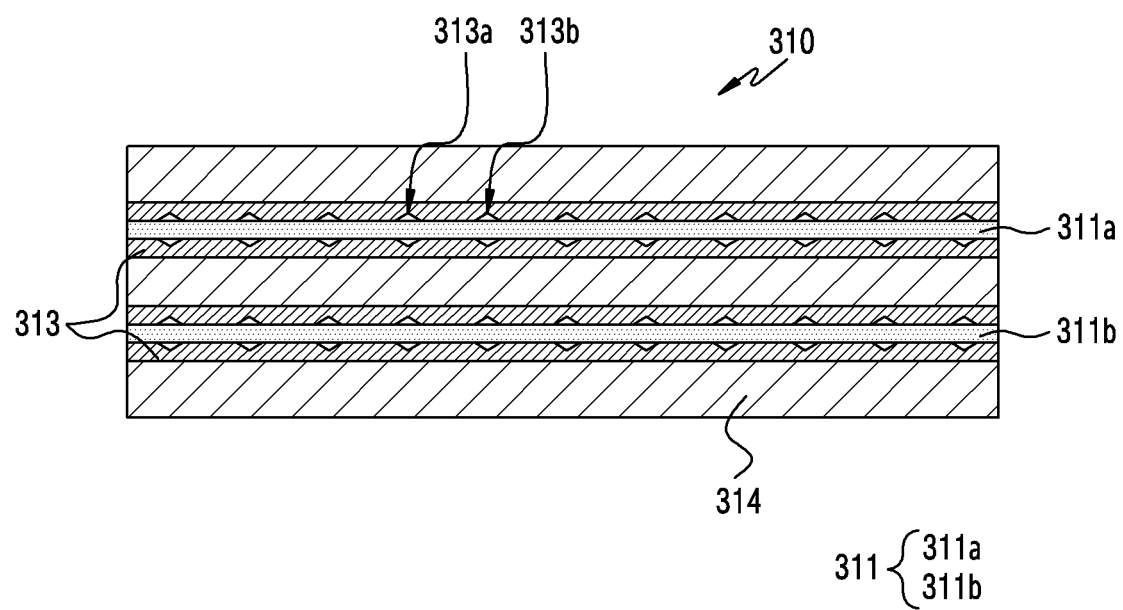
FIG. 5E is a top plan view illustrating the first printed circuit board included in a printed circuit board according to another embodiment.

FIG. 5A is a side view illustrating a first printed circuit board included in a printed circuit board according to an embodiment, and FIG. 5B is a top plan view illustrating the first printed circuit board included in the printed circuit board according to an exemplary embodiment. In addition, FIG. 5C is a top plan view illustrating the first printed circuit board included in a printed circuit board according to another embodiment, FIG. 5D is a top plan view illustrating first printed circuit board included in a printed circuit board according to another embodiment, and FIG. 5E is a top plan view illustrating the first printed circuit board included in a printed circuit board according to another embodiment.

FIGS. 5A to 5E illustrate a portion of the second area B of the first printed circuit board 310, and the FIGS. 5B to 5E are perspective views mainly illustrating portions through which current can flow, other than an insulating layer.

Referring to FIGS. 5A and 5B, according to certain embodiments, in a second area (e.g., the second area B in FIGS. 4A and 4B) of a printed circuit board 300 (e.g., the printed circuit board 300 in FIG. 4A), a first printed circuit board 310 (e.g., the first printed circuit board 310 in FIG. 4A) may include a wiring layer 311 (e.g., the wiring layer 311 in FIG. 4A) on which one or more signal wires 311a and 311b (e.g., the signal wires 311a and 311b in FIG. 4B) are disposed, a first ground layer 313 (e.g., the first ground layer 313 in FIG. 4A), and a first insulating layer 312 (e.g., the first insulating layer 312 in FIG. 4A) disposed between the wiring layer 311 and the first ground layer 313. According to an embodiment, on one surface of the first ground layer 313 (e.g., under the first ground layer 313) (e.g., in the direction ② in FIG. 5A), a second insulating layer 314 (e.g., the second insulating layer 314 in FIG. 4A) may be provided. According to an embodiment, the first printed circuit board 310 may further include a fourth insulating layer 317 (e.g., the fourth insulating layer 317 in FIG. 4A) disposed on the wiring layer 311 (e.g., in the direction ① in FIG. 5A), and the fourth insulating layer 317 may insulate the wiring layer 311 together with the first insulating layer 312.

In the illustrated embodiment (e.g., see FIG. 5B), the signal wires 311a and 311b may be disposed to be spaced apart at a predetermined interval as described above. According to an embodiment, at least a portion the wiring layer 311 of the second area B may not be insulated by the fourth insulating layer 317, and thus a partial area of the wiring layer 311 may be exposed to an air layer (e.g., the air layer 340 in FIG. 4A).

In certain embodiments, the first ground layer 313 may include openings 313a and 313b. The first ground layer 313 may include a mesh pattern in which a plurality of openings 313a and 313b are continuously and repeatedly arranged to correspond to an area that overlaps the signal wires 311a and 31b when the first printed circuit board 310 is viewed from thereabove (e.g., in the direction ① in FIG. 5A). According to an embodiment, the openings may include third openings 313 and fourth openings 313b, which are spaced apart from each other by a predetermined interval (e.g., g in FIG. 5B). In an example, in the mesh pattern formed on the first ground layer 313, the third openings 313a and the fourth openings 313b may be alternately arranged at a predetermined interval. However, according to another example (not illustrated), in the mesh pattern, the third openings 313a and the fourth openings 313b may be arranged at irregular intervals. The mesh pattern formed on the first ground layer 313 may be designed by adjusting the forms (e.g., the shapes, widths, and lengths) of the openings and/or the pitch (e.g., the interval between the openings) such that the influence of the first ground layer 313 on the impedance of the signal wires 311a and 311b disposed on the wiring layer 311 can be minimized.

As described above, the impedance value of the printed circuit board 300 is determined according to the characteristics of the signals transmitted through the signal wires 311a and 311b. When the overlapping area between the first ground layer 313 and the wiring layer 311 varies, the impedance value of the printed circuit board 300 may be affected. Specifically, as the overlapping area between the first ground layer 313 and the wiring layer 311 on which the signal wires 311a and 311b are disposed increases, the capacitance value between the first ground layer 313 and the wiring layer 311 may increase. As a result, the impedance value formed between the first ground layer 313 and the wiring layer 311 may decrease.

According to an embodiment, in order to minimize the influence of the first ground layer 313 and the wiring layer 311 on the impedance value of the printed circuit board 300, the openings 313a and 313b formed in the first ground layer 313 may have widths that are greater than those of the signal wires 311a and 311b of the wiring layer 311. The capacitance value between the first ground layer 313 and the wiring layer 311 may decrease through the above-described openings 313a and 313b. When the capacitance value between the first ground layer 313 and the wiring layer 311 decreases, the impedance value of the printed circuit board 300 may increase in an inverse manner. According to an embodiment, in the printed circuit board 300, it is possible to reduce the conductor loss (e.g., resistance R or inductance L) of the signal wires 311a and 311b by increasing the area or width of the wiring layer 311 on which the signal wirings 311a and 311b are disposed. According to an embodiment, with the above-described structure, the printed circuit board 300 is capable of maintaining an impedance value constant while lowering the capacitance value between the first ground layer 313 and the wiring layer 311. Although not illustrated in the drawings, according to certain embodiments, the openings 313a and 313b may be formed to have a width which is the same as or similar to that of the signal wires 311a and 311b of the wiring layer 311.

When the mesh pattern is formed on the first ground layer 313, it is possible not only to block the influence that may affect the impedance of the signal wires 311a and 311b since the signal wires 311a and 311b and the first ground layer 313 form a capacitor when there is no mesh pattern, but also to obtain an advantage in that the printed circuit board 300 can be more flexible.

In an example (e.g., see FIG. 5B), the openings 313a and 313b are formed in a hexagonal shape, and may be arranged at regular or irregular intervals on the first ground layer 313, but the shapes of the openings 313a and 313b may be designed differently according to embodiments. For example, the openings 313a and 313b according to an embodiment (e.g., see FIG. 5C) may have a quadrangular shape, and the openings 313a and 313b according to another embodiment (e.g., see FIG. 5D) may have a circular shape or an elliptical shape. The openings 313a and 313b according to another embodiment (e.g., FIG. 5E) may have a rhombus shape, and although not illustrated in the drawings, as an example, the third openings 313a and the fourth openings 313b may have different shapes (e.g., a hexagonal shape and a quadrangular shape).

In the illustrated embodiment, the first ground layer 313 has been described as including a mesh pattern, but is not limited thereto. In an embodiment, the first ground layer 313 may have a different pattern, and in an embodiment, the first ground layer 313 may be formed of a flat metal layer without a pattern.

Figure 6:
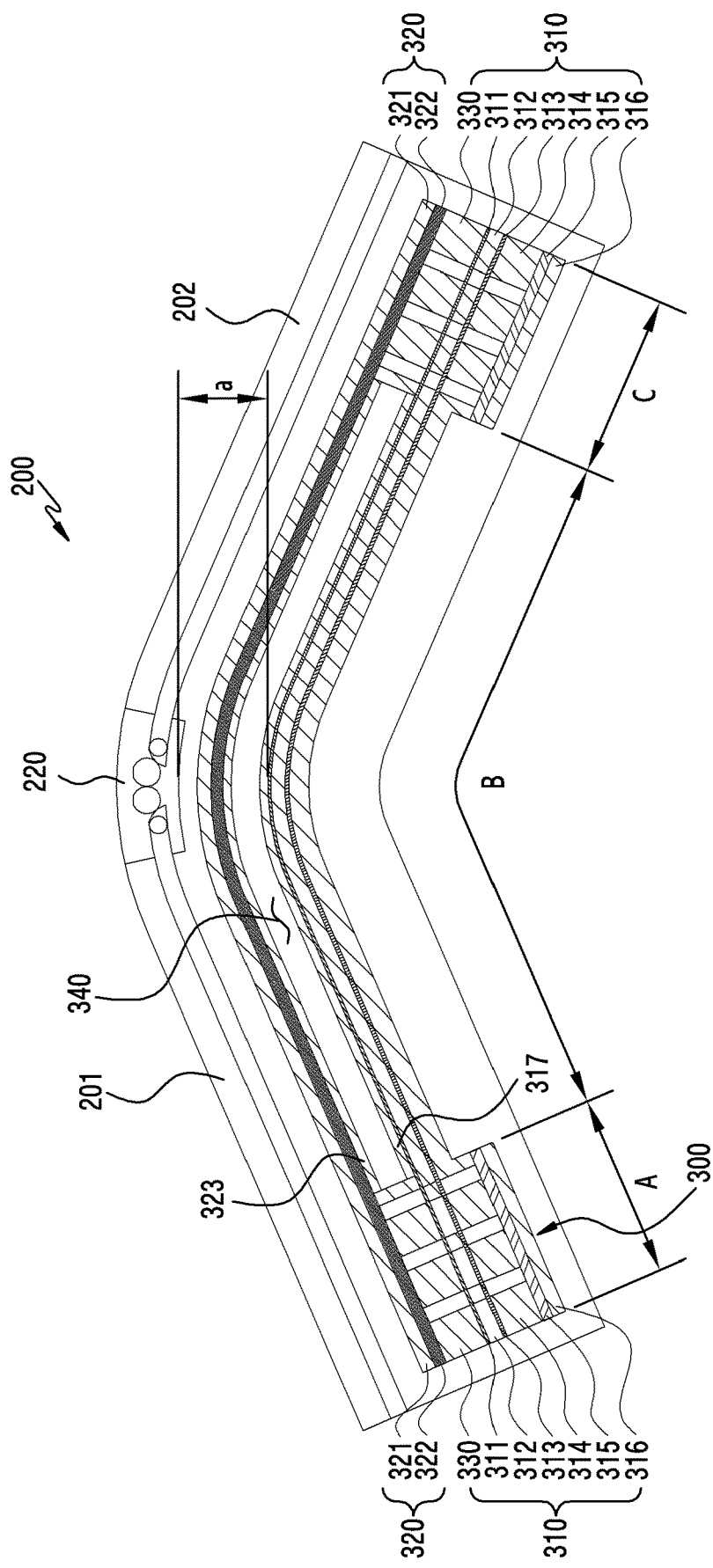
FIG. 6 is a side view illustrating a positional relationship between a hinge structure inside an electronic device and a printed circuit board according to an embodiment.
Figure 7:
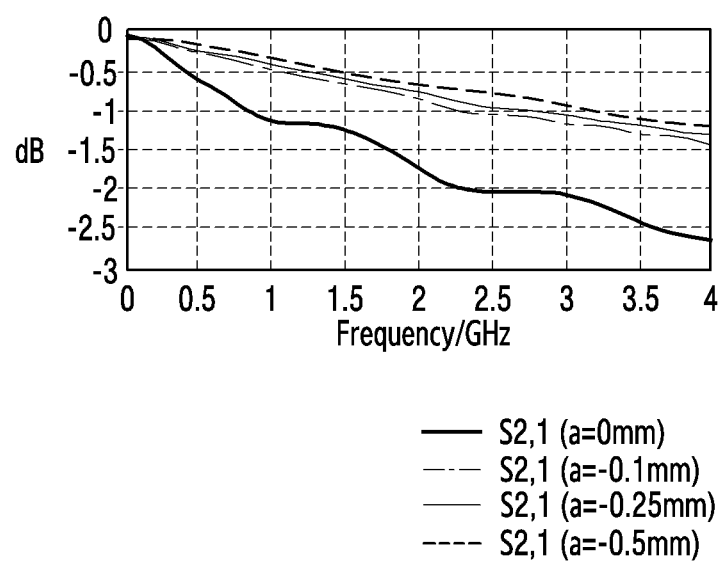
FIG. 7 is a view illustrating signal transmission performance according to a proximity distance of a conductor of a printed circuit board, which does not include a second printed circuit board.

FIG. 6 is a side view illustrating a positional relationship between a hinge structure inside an electronic device and a printed circuit board according to an embodiment. FIG. 7 is a view illustrating signal transmission performance according to a proximity distance of a conductor of a printed circuit board, which does not include a second printed circuit board, and FIG. 8 is a view illustrating signal transmission performance of a printed circuit board according to certain embodiments.

Referring to FIG. 6, according to an embodiment, an electronic device 200 (e.g., the electronic device 200 in FIG. 2A) may include a first housing 201 (e.g., the first housing 201 in FIG. 2A), a second housing 202 (e.g., the second housing 202 in FIG. 2A), and a hinge structure 220 (or a "hinge assembly") rotatably connecting the first housing 201 and the second housing 202 to each other so as to make the electronic device 200 foldable. At least one of the components of the electronic device 200 of FIG. 6 may be similar to at least one of the components of the electronic device 200 of FIG. 2A, and redundant descriptions will be omitted below.

According to an embodiment, the electronic device 200 may include a printed circuit board 300 (e.g., the printed circuit board 300 in FIG. 4A) inside the first housing 201 and/or the second housing 202. The printed circuit board 300 may extend from at least one area of the first housing 201 to at least one area of the second housing 202 via the hinge structure 220. As an example, the printed circuit board 300 may include a first printed circuit board 310 (e.g., the first printed circuit board 310 in FIG. 4A), and a second printed circuit board 320 (e.g., the second printed circuit board 320 in FIG. 4A). The printed circuit board 320 may be divided into a first area A at one end thereof, a third area C at the other end thereof, and a second area B between the first area A and the third area C. However, at least one of the components of the printed circuit board 300 of FIG. 6 is the same as or similar to at least one of the components of the printed circuit board 300 of FIGS. 3A and 4A, and thus, redundant descriptions will be omitted below.

Figure 8:
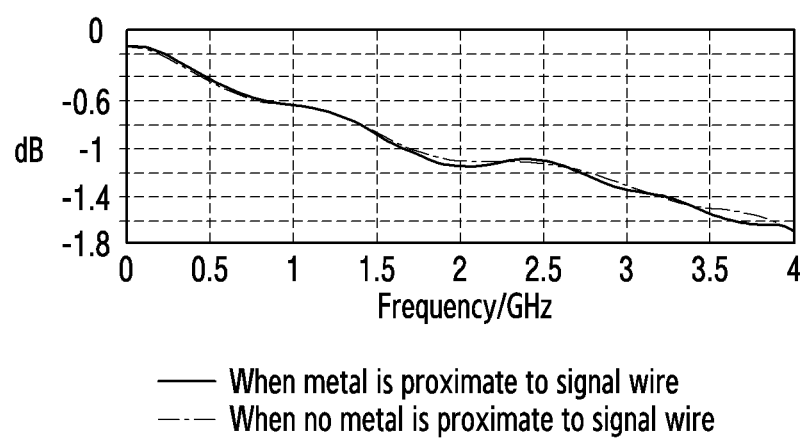
FIG. 8 is a view illustrating signal transmission performance of a printed circuit board according to certain embodiments.

Referring to FIGS. 7 and 8, the printed circuit board 300 may transmit signals having various frequencies via the wiring layer 311 on which signal wires (e.g., the signal wires 311a and 311b in FIG. 5B) are formed. During signal transmission, a loss may occur, which may degrade signal transmission performance. In an example, a conductor (e.g., metal) may be disposed in at least one area of the hinge structure 220 facing the printed circuit board 300. In the process of folding the electronic device 200, a case in which the conductor of the hinge structure 220 is proximate to the wiring layer 311 on which the signal wires are disposed may occur. When a conductor (e.g., metal) is proximate to a signal wire, as shown in the graph of FIG. 7, the impedance and/or loss of the signal wire may increase, resulting in a decrease in signal transmission performance.

Specifically, the graph of FIG. 7 shows transmission loss according to a proximity distance (e.g., "a" in FIG. 6) between a signal wire and a conductor (e.g., metal) disposed in an area of a hinge structure (e.g., the hinge structure 200 in FIG. 6) facing the wiring layer (e.g., the wiring layer 311 in FIG. 6) measured in dB as a function of frequency. It can be seen from the graph of FIG. 7 that the transmission loss of the signal wire increases as the proximity distance a between the signal wire and the conductor of the hinge structure 220 is reduced (e.g., becoming smaller). That is, the closer the signal wires 311a and 311b are to the hinge structure, the greater the signal loss. For example, when there is no distance between the signal wires 311a and 311b, and the hinge structure, there is as much as a −2.5 dB loss at 3.5 GHz. This loss is reduced to less than −1 dB at 3.5 GHz for a distance of −0.5 mm.

Accordingly, according to certain embodiments, the printed circuit board 300 may include a second printed circuit board 320 for protecting signal wires on the first circuit board 310 (e.g., the signal wires 311a and 311b in FIG. 4B) from a conductor (e.g., metal) disposed in the hinge structure 220 in the process of folding the electronic device 200. Specifically, the second printed circuit board 320 can be used to create separation between the hinge structure 220 and the signal wires 311.

That is, according to an embodiment, the electronic device 200 is capable of limiting the proximity distance a between the signal wire and the conductor of the hinge conductor using the printed circuit board 300 including the second printed circuit board 320, and is capable of suppressing the increase of impedance and/or loss of a signal wire due to the proximity of the conductor.

The graph of FIG. 8 shows transmission loss of a signal wire according to the frequency of a transmission signal under conditions in which the metal of the hinge structure 220 is proximate to a signal wires (e.g., 311a or 311b in FIG. 4B) of the printed circuit board 300 according to certain embodiments and in which there is no metal.

According to an embodiment, the printed circuit board 300 is capable of blocking proximity of a metal disposed in an area of the hinge structure 220 to a signal wire disposed on the wiring layer 311 of the first printed circuit board 310 beyond a predetermined distance using the second printed circuit board 320 disposed above the first printed circuit 310, with the air layer 340 interposed therebetween. Accordingly, it is possible to minimize the occurrence of impedance and/or loss of a signal wire due to a metal disposed in an area of the hinge structure 220 during the process of folding the electronic device 200.

That is, from the graph of FIG. 8, it can be seen that the printed circuit board 300 according to an embodiment is able to have a signal transmission loss value that is almost similar to that of a metal-free condition even in the condition in which a metal of the hinge structure 220 is proximate to a signal wire.

Figure 9:
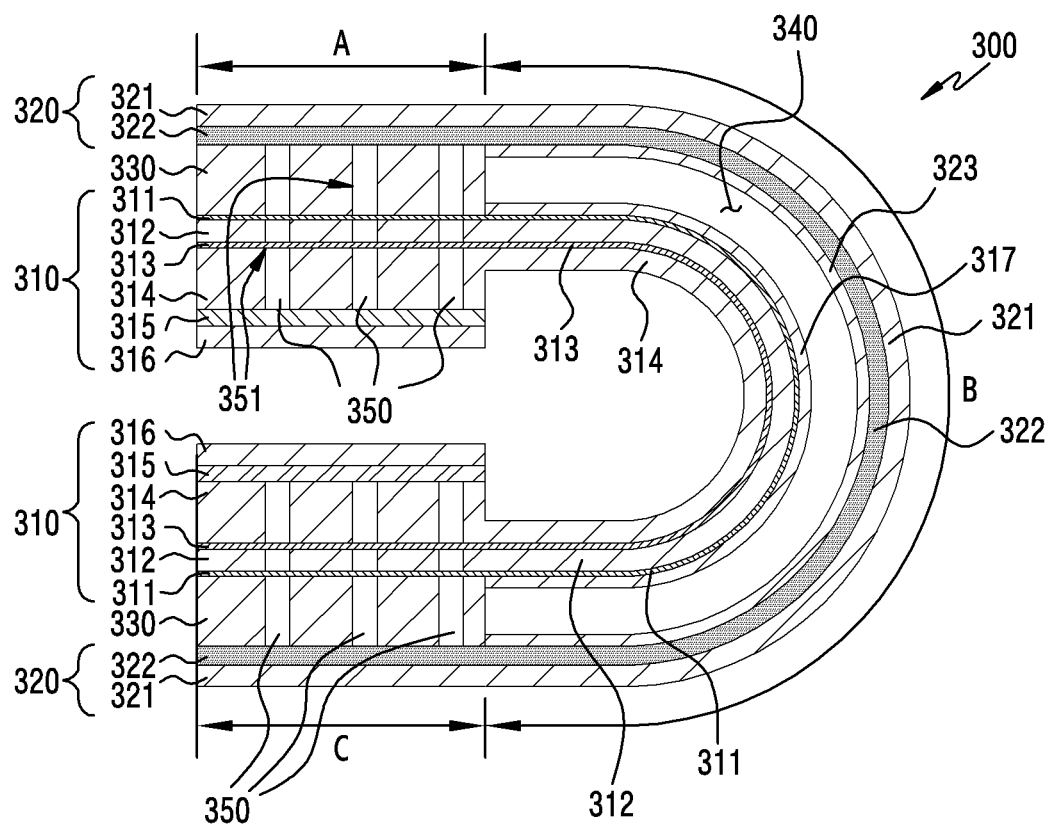
FIG. 9 is a view illustrating an example in which a printed circuit board according to certain embodiments is used in an electronic device.

FIG. 9 is a view illustrating an example in which a printed circuit board according to certain embodiments is used in an electronic device. According to certain embodiments, the printed circuit board 300 is applicable to the electronic device 101 illustrated in FIG. 1 and the electronic device 200 illustrated in FIG. 2A.

Referring to FIG. 9, according to certain embodiments, the printed circuit board 300 (e.g., the printed circuit board 300 in FIG. 4A) may be divided into a first area A and a third area 3B, in which an insulating layer 330 (e.g., the insulating layer 330 in FIG. 4A) is interposed between the first printed circuit board 310 (e.g., the first printed circuit board 310 in FIG. 4A) and the second printed circuit board 320 (e.g., the second printed circuit board 320 in FIG. 4A), and a second area B, which extends from the first area A to the third area 3B and in which an air layer 340 is interposed between the first printed circuit board 310 and the second printed circuit board 320. Here, in the foregoing description, it has been assumed that the first area A of the printed circuit board 300 and the third area C of the printed circuit board 300 have multiple layers, which are the same as or similar to each other, and are symmetrical to each other, but the disclosure is not limited thereto. The first area A of the printed circuit board 300 and the third area C of the printed circuit board 300 may have different multilayer structures.

The first printed circuit board 310 of the printed circuit board 300 according to certain embodiments has a multi-layer structure including a wiring layer 311, a first insulating layer 312, and a first ground layer 313, while the second printed circuit board 220 may have a multilayer structure including a fifth insulating layer 321 and a third ground layer 322. At least one of the components of the printed circuit board 300 of FIG. 9 is the same as or similar to at least one of the components of the printed circuit board 300 of FIG. 4A, and redundant descriptions will be omitted below.

Since the insulating layer 330 is interposed between the first printed circuit board 310 and the second printed circuit board 320 in the first area A or the third area C of the printed circuit board 300 according to certain embodiments and one or more vias 350 made of a conductive material penetrate the first printed circuit board 310, the second printed circuit board 320 and the insulating layer 330, the ground layers (e.g., the first ground layers 313) included in the first printed circuit board 310 and the ground layer (e.g., the third ground layer 322) included in the second printed circuit board 320 may be electrically connected to each other.

In the second area B of the printed circuit board 300 according to certain embodiments, the air layer 340 is interposed between the first printed circuit board 310 and the second printed circuit board 320. The second printed circuit board 320 is capable of protecting the wiring layer 311, which is disposed on the top surface of the first printed circuit board 310 (e.g., the surface, which is in contact with the fourth insulating layer 317), from an influence due to proximity of an external metal (e.g., a metal disposed in the hinge structure 220 in FIG. 6). In addition, as illustrated in the drawings, the second area B of the printed circuit board 300 according to an embodiment can be more easily deformed (e.g., bent or curved) than the first area A or the third area C of the printed circuit board 300.

According to certain embodiments, the printed circuit board 300 may electrically connect the components of an electronic device (e.g., the electronic device 101 in FIG. 1 or the electronic device 200 in FIG. 2A) so as to provide a signal wire for transmitting data or power signals.

In an embodiment, the electronic device may include a communication circuit capable of supporting connection with a 5G network, and the printed circuit board 300 may provide an RF signal wire for transmitting a 5G Above-6 RF signal from the communication circuit to an antenna. In this case, the printed circuit board 300 is capable of preventing an increase in impedance and/or loss of the RF signal wire due to, for example, proximity of metal, and is capable of suppressing deterioration of RF signal transmission performance due to proximity of metal.

According to certain embodiments, the printed circuit board 300 may be disposed in a folding area of a foldable electronic device (e.g., the electronic device 200 in FIG. 2A) including a first housing (e.g., the first housing 201 in FIG. 2A) and a second housing (e.g., the second housing 202 in FIG. 2A) and may electrically connect the components of the electronic device disposed in the first housing and the components of the electronic device disposed in the second housing to each other, thereby providing a signal wire for transmitting data and/or power signals.

In an embodiment, the electronic device may have a folding structure in which the first housing and the second housing are rotatable about one axis by a connector, thereby switching from a folded state to an unfolded state or from an unfolded state to a folded state. In this case, a circuit board, on which components for implementing various functions of the electronic device are mounted, may be disposed inside each of the first and second housings, and the connector may include a hinge structure including metal and a wiring member extending across the connector. According to an exemplary embodiment, the printed circuit board 300 may provide a signal wire that satisfies a condition in which signal transmission performance is not degraded even if the printed circuit board 300 has to be bent and is disposed at a position adjacent to metal included in the electronic device.

According to an embodiment, a printed circuit board (e.g., the printed circuit board 300 in FIG. 3A) may include: a first printed circuit board (e.g., the first printed circuit board 310 in FIG. 3A) including a first ground layer (e.g., the first ground layer 313 in FIG. 3A) having one or more openings formed therein and a wiring layer (e.g., the wiring layer 311 in FIG. 3A) on which a signal wire (e.g., the signal wires 311*a* and 311*b* in FIG. 3A) is disposed; and a second printed circuit board (e.g., the second printed circuit board 320 in FIG. 3A) including a second ground layer (e.g., the third ground layer 322 in FIG. 3A) having one or more openings formed therein. The printed circuit board may further include: a first area (e.g., the first area A in FIG. 9) and a third area (e.g., the third area C in FIG. 9) in which the first printed circuit board and the second printed circuit board are connected to each other via an insulating layer (e.g., the insulating layer 330 in FIGS. 4A and 9); and a second area (e.g., the second area B in FIG. 9), which extends from the first area to the third area, and in which the first printed circuit board and the second printed circuit board are spaced apart from each other, with an air layer (e.g., the air layer 340 in FIGS. 4A and 9) interposed therebetween.

According to an embodiment, the first ground layer may be formed as a ground of a first mesh pattern including the one or more openings.

According to an embodiment, the second ground layer may be formed as a ground of a second mesh pattern including the one or more openings.

According to an embodiment, in the first mesh pattern, the one or more openings, which have the same shape, may be arranged at a predetermined interval along the signal wire.

According to an embodiment, in the second mesh pattern, the one or more openings, which have the same shape, may be arranged at a predetermined interval along the signal wire.

According to an embodiment, in the first area or the third area of the printed circuit board, one or more vias (e.g., the one or more vias 350 in FIG. 4A) penetrate the first printed circuit board, the second printed circuit board, and the insulating layer.

According to an embodiment, the one or more vias may electrically connect the first ground layer and the second ground layer to each other.

According to an embodiment, the wiring layer may further include a metal member (e.g., the metal member 311*c* in FIG. 3A), which is in electrical contact with the one or more vias.

According to an embodiment, the second area of the printed circuit board may include no via.

According to an embodiment, the second area of the printed circuit board may be more easily deformed than the first area or the third area of the printed circuit board.

According to an embodiment, a printed circuit board (e.g., the printed circuit board 300 in FIG. 4A) may include: a first printed circuit board (e.g., the first printed circuit board 310 in FIG. 4A) including a wiring layer (e.g., the wiring layer 313 in FIG. 4A) having a signal wire disposed thereon and disposed on the top surface of a first insulating layer (e.g., the first insulating layer 312 in FIG. 4A) and a first ground layer (e.g., the first ground layer 313 in FIG. 4A) disposed on the bottom surface of the first insulating layer; and a second printed circuit board (e.g., the second printed circuit board 320 in FIG. 4A) including a second ground layer (e.g., the third ground layer 322 in FIG. 4A) having one or more openings formed therein. The printed circuit board may further include: a first area (e.g., the first area A in FIG. 9) and a third area (e.g., the third area C in FIG. 9) in which an insulating layer (e.g., the insulating layer 330 in FIG. 4A) is interposed between the first printed circuit board and the second printed circuit board; and a second area (e.g., the second area B in FIG. 9), which extends from the first area to the third area, and in which the first printed circuit board and the second printed circuit board are spaced apart from each other, with an air layer (e.g., the air layer 340 in FIGS. 4A and 9) interposed therebetween.

According to an embodiment, an electronic device (e.g., the electronic device 200 in FIGS. 2A and 2B) may include: a communication circuit; and a printed circuit board (e.g., the printed circuit board 300 in FIGS. 2A and 2B) electrically connected to the communication circuit, wherein the printed circuit board may include: a first printed circuit board (e.g., the first printed circuit board 310 in FIG. 3A) including a first ground layer (e.g., the first ground layer 313 in FIG. 3A) having one or more openings formed therein and a wiring layer (e.g., the wiring layer 311 in FIG. 3A) on which a signal wire (e.g., the signal wires 311*a* and 311*b* in FIG. 3A) is disposed; and a second printed circuit board (e.g., the second printed circuit board 320 in FIG. 3A) including a second ground layer (e.g., the third ground layer 322 in FIG. 3A) having one or more openings formed therein. The printed circuit board may further include: a first area (e.g., the first area A in FIG. 9) and a third area (e.g., the third area C in FIG. 9) in which the first printed circuit board and the second printed circuit board are connected to each other via an insulating layer (e.g., the insulating layer 330 in FIGS. 4A and 9); and a second area (e.g., the second area B in FIG. 9), which extends from the first area to the third area, and in which the first printed circuit board and the second printed circuit board are spaced apart from each other, with an air layer (e.g., the air layer 340 in FIGS. 4A and 9) interposed therebetween.

According to an embodiment, the second ground layer may be formed as a ground of a mesh pattern including the one or more openings.

According to an embodiment, in the mesh pattern, the one or more openings, which have the same shape, may be arranged at a predetermined interval along the signal wire.

According to an embodiment, in the first area or the third area of the printed circuit board, one or more vias (e.g., the one or more vias 350 in FIG. 4A) penetrate the first printed circuit board, the second printed circuit board, and the insulating layer.

According to an embodiment, the one or more vias may electrically connect the first ground layer and the second ground layer to each other.

According to an embodiment, the second area of the printed circuit board may be more easily deformed than the first area or the third area of the printed circuit board.

According to an embodiment, the electronic device may further include: a foldable housing (e.g., the foldable housing 203 in FIG. 2A) including a first housing (e.g., the first housing 201 in FIGS. 2A and 6), a second housing (e.g., the second housing 202 in FIGS. 2A and 6), and a connector (e.g., the hinge structure 220 in FIG. 6) configured to connect the first housing and the second housing to each other so as to be rotatable about one axis, wherein the connector may include a conductor (metal), and the second area of the printed circuit board extends from the first housing to the second housing across the connector, and may include an area having a proximity distance (e.g., a in FIG. 6) to the conductor, the proximity distance being changed in the process in which the first housing and the second housing rotate.

According to an embodiment, the communication circuit is capable of supporting connection with a 5G network.

According to another embodiment, an electronic device (e.g., the electronic device 200 in FIGS. 2A and 2B) may include: a printed circuit board (e.g., the printed circuit board 300 in FIGS. 2A and 2B), wherein the printed circuit board may include: a first printed circuit board (e.g., the first printed circuit board 310 in FIG. 3A) including a first ground layer (e.g., the first ground layer 313 in FIG. 3A) having one or more openings formed therein and a wiring layer (e.g., the wiring layer 311 in FIG. 3A) on which a signal wire (e.g., the signal wires 311a and 311b in FIG. 3A) is disposed; and a second printed circuit board (e.g., the second printed circuit board 320 in FIG. 3A) including a second ground layer (e.g., the third ground layer 322 in FIG. 3A) having one or more openings formed therein. The printed circuit board may further include: a first area (e.g., the first area A in FIG. 9) and a third area (e.g., the third area C in FIG. 9) in which the first printed circuit board and the second printed circuit board are connected to each other via an insulating layer (e.g., the insulating layer 330 in FIGS. 4A and 9); and a second area (e.g., the second area B in FIG. 9), which extends from the first area to the third area, and in which the first printed circuit board and the second printed circuit board are spaced apart from each other, with an air layer (e.g., the air layer 340 in FIGS. 4A and 9) interposed therebetween.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An apparatus comprising:
a first printed circuit board comprising a first ground layer having a first one or more openings formed therein and a wiring layer on which a signal wire is disposed;
a second printed circuit board comprising a second ground layer having a second one or more openings formed therein;
insulating layers interposed between the first printed circuit board and the second printed circuit board, in a first area and a third area corresponding to side portions of the apparatus; and
at least one via electrically connecting the first printed circuit board and the second printed circuit board in the first area and the third area,
wherein the first printed circuit board and the second printed circuit board are spaced apart from each other to form an air layer, in a second area extending from the first area to the third area,
wherein the first ground layer extends from the first area, through the second area, to the third area along the first printed circuit board,
wherein the second ground layer extends from the first area, through the second area, to the third area along the second printed circuit board,
wherein the air layer separates the first printed circuit board and the second printed circuit board throughout the entire second area,
wherein the second one or more openings are formed in the second printed circuit board in the first area, the second area, and the third area of the apparatus,
wherein the at least one via is included in the first area and the third area among the first area, the second area, and the third area, and
wherein a portion of the apparatus corresponding to the second area is flexible.

2. The apparatus of claim 1, wherein the first ground layer is formed as a ground of a first mesh pattern including the first one or more openings.

3. The apparatus of claim 2, wherein, in the first mesh pattern, the first one or more openings, which have a same shape, are arranged at a predetermined interval along the signal wire.

4. The apparatus of claim 1, wherein the second ground layer is formed as a ground of a second mesh pattern including the second one or more openings.

5. The apparatus of claim 4, wherein, in the second mesh pattern, the second one or more openings, which have a same shape, are arranged at a predetermined interval along the signal wire.

6. The apparatus of claim 1, wherein, in the first area or the third area of the printed circuit board, the at least one via penetrates the first printed circuit board, the second printed circuit board, and at least one of the insulating layers in the first area and the third area.

7. The apparatus of claim 6, wherein the wiring layer further comprises a metal member, which comes into electrical contact with the one or more vias.

8. The apparatus of claim 1, wherein the second area of the printed circuit board includes no via.

9. The apparatus of claim 1, wherein the second area of the printed circuit board is more flexible than the first area or the third area of the printed circuit board.

10. An apparatus comprising:
a first printed circuit board comprising a wiring layer having a signal wire disposed thereon and disposed on a top surface of a first insulating layer, and a first ground layer disposed on a bottom surface of the first insulating layer;
a second printed circuit board comprising a second ground layer having one or more openings formed therein;
second insulating layers interposed between the first printed circuit board and the second printed circuit board, in a first area and a third area corresponding to side portions of the apparatus; and
one or more vias electrically connecting the first printed circuit board and the second printed circuit board in the first area and the third area,
wherein the first printed circuit board and the second printed circuit board are spaced apart from each other to form an air layer, in a second area extending from the first area to the third area,
wherein the first ground layer extends from the first area, through the second area, to the third area along the first printed circuit board,
wherein the second ground layer extends from the first area, through the second area, to the third area along the second printed circuit board,
wherein the air layer separates the first printed circuit board and the second printed circuit board throughout the entire second area,
wherein the one or more openings are formed in the second printed circuit board in the first area, the second area, and the third area of the apparatus,
wherein the one or more vias are included in the first area and the third area among the first area, the second area, and the third area, and
wherein a portion of the apparatus corresponding to the second area is flexible.

11. An electronic device comprising:
a communication circuit; and
a printed circuit board electrically connected to the communication circuit;
wherein the printed circuit board comprises:
a first printed circuit board comprising a first ground layer having a first one or more openings formed therein and a wiring layer on which a signal wire is disposed;
a second printed circuit board comprising a second ground layer having a second one or more openings formed therein;

insulating layers interposed between the first printed circuit board and the second printed circuit board, in a first area and a third area corresponding to side portions of the electronic device; and one or more vias electrically connecting the first printed circuit board and the second printed circuit board in the first area and the third area;

wherein the first printed circuit board and the second printed circuit board are spaced apart from each other to form an air layer, in a second area extending from the first area to the third area, wherein the first ground layer extends from the first area, through the second area, to the third area along the first printed circuit board, wherein the second ground layer extends from the first area, through the second area, to the third area along the second printed circuit board, wherein the air layer separates the first printed circuit board and the second printed circuit board throughout the entire second area, wherein the second one or more openings are formed in the second printed circuit board in the first area, the second area, and the third area of the apparatus, wherein the one or more vias are included in the first area and the third area among the first area, the second area, and the third area, and wherein a portion of the apparatus corresponding to the second area is flexible.

12. The electronic device of claim 11, wherein the second ground layer is formed as a ground of a mesh pattern including the second one or more openings.

13. The electronic device of claim 12, wherein, in the mesh pattern, the second one or more openings, which have a same shape, are arranged at a predetermined interval along the signal wire.

14. The electronic device of claim 11, wherein, in the first area or the third area of the printed circuit board, the at least one via penetrates the first printed circuit board, the second printed circuit board, and at least one of the insulating layers.

15. The electronic device of claim 11, wherein the second area of the printed circuit board is more flexible than the first area or the third area of the printed circuit board.

16. The electronic device of claim 11, further comprising:
a foldable housing comprising a first housing, a second housing, and a connector configured to connect the first housing and the second housing to each other so as to be rotatable about one axis, wherein the second area of the printed circuit board extends from the first housing to the second housing across the connector, and comprises an area having a proximity distance to the connector, the proximity distance being changed in a process in which the first housing and the second housing rotate.

17. The electronic device of claim 11, wherein the communication circuit is configured to support connection with a 5G network.

18. An electronic device comprising:
a printed circuit board,
wherein the printed circuit board comprises:
a first printed circuit board comprising a first ground layer having one or more openings formed therein and a wiring layer on which a signal wire is disposed;
a second printed circuit board comprising a second ground layer having one or more openings formed therein;
insulating layers interposed between the first printed circuit board and the second printed circuit board, in a first area and a third area corresponding to side portions of the electronic device; and
one or more vias electrically connecting the first printed circuit board and the second printed circuit board in the first area and the third area, wherein the first printed circuit board and the second printed circuit board are spaced apart from each other to form an air layer, in a second area extending from the first area to the third area, wherein the first ground layer extends from the first area, through the second area, to the third area along the first printed circuit board, wherein the second ground layer extends from the first area, through the second area, to the third area along the second printed circuit board, wherein the air layer separates the first printed circuit board and the second printed circuit board throughout the entire second area, wherein the one or more vias are included in the first area and the third area among the first area, the second area, and the third area, and wherein a portion of the apparatus corresponding to the second area is flexible.

* * * * *